(12) United States Patent
Huang et al.

(10) Patent No.: US 10,902,651 B2
(45) Date of Patent: Jan. 26, 2021

(54) SYSTEMS AND METHODS FOR MAGNETIC RESONANCE IMAGE RECONSTRUCTION

(71) Applicants: SHANGHAI UNITED IMAGING INTELLIGENCE CO., LTD., Shanghai (CN); SHANGHAI UNITED IMAGING HEALTHCARE CO., LTD., Shanghai (CN)

(72) Inventors: Xiaoqian Huang, Shanghai (CN); Guobin Li, Shanghai (CN); Nan Liu, Shanghai (CN); Yang Xin, Shanghai (CN)

(73) Assignees: SHANGHAI UNITED IMAGING HEALTHCARE CO., LTD., Shanghai (CN); SHANGHAI UNITED IMAGING INTELLIGENCE CO., LTD., Shanghai (CN)

( * ) Notice: Subject to any disclaimer, the term of this patent is extended or adjusted under 35 U.S.C. 154(b) by 0 days.

(21) Appl. No.: 16/235,203

(22) Filed: Dec. 28, 2018

(65) Prior Publication Data

US 2020/0090382 A1    Mar. 19, 2020

(30) Foreign Application Priority Data

Sep. 18, 2018   (CN) .......................... 2018 1 1089037

(51) Int. Cl.
*G06K 9/00*  (2006.01)
*G06T 11/00*  (2006.01)
(Continued)

(52) U.S. Cl.
CPC ........ *G06T 11/006* (2013.01); *G01R 33/4818* (2013.01); *G01R 33/561* (2013.01);
(Continued)

(58) Field of Classification Search
None
See application file for complete search history.

(56) References Cited

U.S. PATENT DOCUMENTS

| 2015/0192654 | A1 | 7/2015 | Zhu |
| 2018/0292484 | A1 | 10/2018 | Hoppe et al. |
| 2019/0353741 | A1* | 11/2019 | Bolster, Jr. ....... G01R 33/56509 |

FOREIGN PATENT DOCUMENTS

| CN | 104217448 A | 2/2014 |
| CN | 106373167 A | 2/2017 |

(Continued)

OTHER PUBLICATIONS

Pruessmann K P et al., SENSE: Sensitivity Encoding for Fast MRI, Magnetic Resonance in Medicine, 42(5): 952-962, 1999.

(Continued)

*Primary Examiner* — Atiba O Fitzpatrick
(74) *Attorney, Agent, or Firm* — Metis IP LLC

(57) ABSTRACT

The disclosure relates to systems and methods for magnetic resonance imaging (MRI). A method may include obtaining k-space data associated with MR signals acquired by an MR scanner. The k-space data may corresponding to a first sampling rate. The method may also include generating one or more estimated images based on the k-space data and a target neural network model. The one or more estimated images may correspond to a second sampling rate that exceeds the first sampling rate. The method may further include determining one or more target images based on the one or more estimated images and the k-space data using a compressed sensing model. The compressed sensing model may be constructed based on the one or more estimated images.

20 Claims, 12 Drawing Sheets

(51) Int. Cl.
    *G06N 20/00* (2019.01)
    *G01R 33/48* (2006.01)
    *G01R 33/56* (2006.01)
    *G01R 33/561* (2006.01)
    *G06N 3/08* (2006.01)

(52) U.S. Cl.
    CPC .......... *G01R 33/5608* (2013.01); *G06N 3/08* (2013.01); *G06N 20/00* (2019.01); *G06T 2211/424* (2013.01)

(56) References Cited

FOREIGN PATENT DOCUMENTS

| | | |
|---|---|---|
| CN | 106815806 A | 6/2017 |
| CN | 107182216 A | 9/2017 |
| CN | 107690070 A | 2/2018 |
| CN | 108171762 A | 6/2018 |
| CN | 108335339 A | 7/2018 |
| CN | 108535675 A | 9/2018 |
| CN | 109325985 A | 2/2019 |
| WO | 2018106805 A1 | 6/2018 |

OTHER PUBLICATIONS

Mark A. Griswold et al., Generalized Autocalibrating Partially Parallel Acquisitions (GRAPPA), Magnetic Resonance in Medicine, 47(6): 1202-1210, 2002.

Michael Lustig et al., Sparse MRI: The Application of Compressed Sensing for Rapid MR Imaging, Magnetic Resonance in Medicine, 58(6): 1182-1195, 2007.

M. Lustig et al., L1 SPIR-iT: Autocalibrating Parallel Imaging Compressed Sensing, International Society for Magnetic Resonance in Medicine, p. 379, 2009.

Liu F et al., Compressed Sensing MRI Combined with SENSE in Partial k-space, Physics in Medicine and Biology, 57 (21): N391-N403, 2012.

Olaf Ronneberger et al., U-Net: Convolutional Networks for Biomedical Image Segmentation, 2015.

Allan Zelener et al., CNN-based Object Segmentation in Urban LIDAR With Missing Points, International Conference on 3D Vision(3DV), 417-425, 2016.

Ian J. Goodfellow et al., Generative Adversarial Nets, international Conference on Neural Information Processing Systems, 2014.

International Search Report in PCT/CN2019/087098 dated Aug. 21, 2019, 4 pages.

Written Opinion in PCT/CN2019/087098 dated Aug. 21, 2019, 5 pages.

Shanhan Wang et al., Accelerating Magnetic Resonance Imaging Via Deep Learning, 2016 IEEE 13th International Symposium on Biomedical Imaging(ISBI), 5 pages, 2016.

Xiaobing Li, Research on Algorithms of Sparse Representation-Based Image Super Resolution, Chinese Master's Theses Full-text Database, 82 pages, 2015.

First Office Action in Chinese Application No. 201811089037.0 dated Dec. 17, 2019, 17 pages.

* cited by examiner

800

```
┌─────────────────────────────────────┐
│ Obtaining multiple groups of training data, │
│ each group of the multiple groups of │
│ training data including image data and │     802
│ reference image data corresponding to the │
│ image data │
└─────────────────────────────────────┘
                    ↓
┌─────────────────────────────────────┐
│ Obtaining a neural network model │     804
└─────────────────────────────────────┘
                    ↓
┌─────────────────────────────────────┐
│ Training neural network model using the │
│ multiple groups of training data to generate │     806
│ a target neural network model │
└─────────────────────────────────────┘
```

FIG. 8

SYSTEMS AND METHODS FOR MAGNETIC RESONANCE IMAGE RECONSTRUCTION

CROSS-REFERENCE TO RELATED APPLICATIONS

This present application claims priority of Chinese Application No. 201811089037.0 filed on Sep. 18, 2018, the entire contents of which are incorporated herein by reference.

TECHNICAL FIELD

This disclosure generally relates to magnetic resonance imaging (MRI) technology, and more particularly, to methods and systems for MR image reconstruction.

BACKGROUND

Magnetic resonance imaging (MRI) systems are widely used in medical diagnosis. MRI systems use magnetic fields and radio waves to generate images of the object to be scanned. The undersampling technique is widely used in MRI systems for sampling MR signals and obtaining k-space data. The undersampling technology may reduce scan time but cause artifacts and/or noises in a reconstructed MR image. Some techniques have been developed to reduce such artifacts and/or noises in reconstructed MR images due to the undersampling technology. For example, the compressed sensing technique has been used in the reconstruction of MR images. However, in using the compressed sensing technique, detailed information in a reconstructed MR image may be lost or missing, which may decrease the quality of the reconstructed MR image. Thus, it is desirable to provide systems and methods for reconstructing an MRI image with improved quality.

SUMMARY

In a first aspect of the present disclosure, a system for magnetic resonance imaging (MRI) is provided. The system may include at least one storage device and at least one processor. The at least one storage medium may store executable instructions. The at least one processor may be configured to communicate with the at least one storage device, wherein when executing the set of instructions, the system may be configured to perform one or more of the following operations. The system may obtain k-space data associated with MR signals acquired by an MR scanner. The k-space data may correspond to a first sampling rate. The system may also generate one or more estimated images based on the k-space data and a target neural network model. The one or more estimated images may correspond to a second sampling rate that exceeds the first sampling rate. The system may further determine one or more target images based on the one or more estimated images and the k-space data using a compressed sensing model. The compressed sensing model may be constructed based on the one or more estimated images.

In some embodiments, the target neural network model may be trained to map first image data to one or more corresponding estimated first image data. A sampling rate associated with the corresponding estimated first image data may exceed a sampling rate associated with the first image data.

In some embodiments, the system may obtain multiple groups of training data. Each group of the multiple groups of training data may include second image data and reference second image data corresponding to the second image data. A sampling rate associated with the reference second image data may exceed a sampling rate associated with the second image data. The system may generate the target neural network model by training a neural network model using the multiple groups of training data.

In some embodiments, the second image data in each group of the multiple groups of training data may include a plurality of second images acquired based on different first pulse sequences. The reference second image data in each group of the multiple groups of training data may be acquired based on a second pulse sequence different from each of the first pulse sequences.

In some embodiments, to generate one or more estimated images based on the k-space data and a target neural network model, the system may reconstruct one or more intermediate images based on the k-space data. The system may generate the one or more estimated images by inputting the one or more intermediate images to the target neural network model.

In some embodiments, to generate one or more estimated images based on the k-space data and a target neural network model, the system may generate estimated k-space data by inputting the k-space data to the target neural network model, the estimated k-space data corresponding to the second sampling rate. The system may reconstruct the one or more estimated images based on the estimated k-space data.

In some embodiments, to reconstruct the one or more target images based on the one or more estimated images and the k-space data, the system may determine, based on the one or more estimated images and the k-space data, an objective function. The objective function may include a consistency term and a regularization term. The consistency term may represent a difference between candidate k-space data associated with one or more candidate images and the k-space data. The regularization term may be constructed based on a sparse transformation model associated with the one or more estimated images. The system may determine the one or more target images by performing a plurality of iterations based on the objective function until a condition is satisfied. Each iteration includes updating the one or more candidate images.

In some embodiments, each iteration of the plurality of iterations may include updating the one or more candidate images based on the one or more estimated images, updating the value of the objective function after each iteration based on the updated candidate images obtained in a most recent iteration; and determining whether the value of the objective function satisfies the condition.

In some embodiments, the sparse transformation model may be constructed based on a differential operation function, the differential operation function being configured to constrain a difference between the one or more estimated images and one of the one or more candidate images.

In some embodiments, the differential operation function may include a weight operator in a spatial domain associated with a confidence level of the one or more estimated images or a weight operator in a frequency domain associated with a confidence level of at least one portion of space data of the one or more estimated images, the space data of the one or more estimated images being acquired by performing Fourier Transform on the one or more estimated images.

In some embodiments, the sparse transformation model may be constructed based on a total variation (TV) operation function, the TV operation function being configured to constrain noises in one of the one or more candidate images based on a noise level of the one or more estimated images.

In some embodiments, the total variation (TV) operation function may include a weight operator associated with the noise level of the one or more estimated images.

In some embodiments, the objective function may further comprise a second regularization term, the second regularization term being configured to constrain sparsity of one of the one or more candidate images.

In some embodiments, to reconstruct the one or more target images based on the one or more estimated images and the k-space data using a compressed sensing model, the system may determine, based on the one or more estimated images and the k-space data, an objective function, the objective function including a consistency term and a third regularization term. The consistency term may represent a difference between candidate k-space data associated with one or more candidate images and the k-space data. The third regularization term may represent a difference between the one or more candidate images and the one or more estimated images. The system may determine the one or more target images by performing a plurality of iterations based on the objective function until a condition is satisfied, wherein each iteration includes updating the one or more candidate images.

In some embodiments, each iteration of the plurality of iterations may include updating the one or more candidate images based on the one or more estimated images, updating the value of the objective function after each iteration based on the updated candidate images obtained in a most recent iteration, and determining whether the value of the objective function satisfies the condition.

In some embodiments, the target neural network model may be constructed based on at least one of a convolutional neural network model (CNN), a fully convolutional neural network (FCN) model, or a generative adversarial network (GAN).

In some embodiments, the k-space data may be acquired by the MR scanner according to a pulse sequence designed based on an undersampling pattern.

In a second aspect of the present disclosure, a method for magnetic resonance imaging (MRI) is provided. The method may be implemented on a computing apparatus, the computing apparatus including at least one processor and at least one storage device. The method may include one or more of the following operations. The at least one processor may obtain k-space data associated with MR signals acquired by an MR scanner. The k-space data may correspond to a first sampling rate. The at least one processor may generate one or more estimated images based on the k-space data and a target neural network model. The one or more estimated images may correspond to a second sampling rate that exceeds the first sampling rate. The at least one processor may determine one or more target images based on the one or more estimated images and the k-space data using a compressed sensing model. The compressed sensing model may be constructed based on the one or more estimated images.

In some embodiments, the at least one processor may determine an objective function based on the one or more estimated images and the k-space data. The objective function may include a consistency term and a regularization term. The consistency term may represent a difference between candidate k-space data associated with one or more candidate images and the k-space data. The regularization term may be constructed based on a sparse transformation model associated with the one or more estimated images. The at least one processor may determine the one or more target images by performing a plurality of iterations based on the objective function until a condition is satisfied. Each iteration may include updating the one or more candidate images.

In a third aspect of the present disclosure, a non-transitory computer readable medium is provided. The non-transitory computer readable medium may include at least one set of instructions that, when executed by at least one processor, cause the at least one processor to effectuate a method. The method may include one or more of the following operations. The at least one processor may obtain k-space data associated with MR signals acquired by an MR scanner. The k-space data may correspond to a first sampling rate. The at least one processor may generate one or more estimated images based on the k-space data and a target neural network model. The one or more estimated images may correspond to a second sampling rate that exceeds the first sampling rate. The at least one processor may determine one or more target images based on the one or more estimated images and the k-space data using a compressed sensing model. The compressed sensing model may be constructed based on the one or more estimated images.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 8 is a flowchart illustrating an exemplary process for training a neural network model according to some embodiments of the present disclosure;

DETAILED DESCRIPTION

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but is to be accorded the widest scope consistent with the claims.

It will be understood that the term "system," "engine," "unit," "module," and/or "block" used herein are one method to distinguish different components, elements, parts, section or assembly of different level in ascending order. However, the terms may be displaced by another expression if they may achieve the same purpose.

Figure 2:
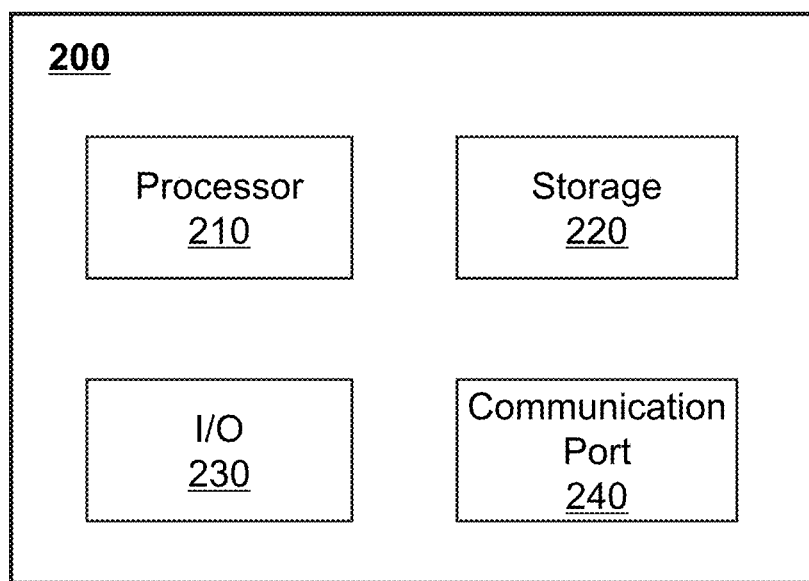
FIG. 2 is a schematic diagram illustrating hardware and/or software components of an exemplary computing device on which the processing device may be implemented according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 210 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an Erasable Programmable Read Only Memory (EPROM). It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments in the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

The present disclosure relates to methods and systems for MR image reconstruction. The method may include obtaining k-space data associated with MR signals acquired by an MR scanner, the k-space data corresponding to a first sampling rate. The method may also obtain a target neural network model configured to mapping first image data associated with a lower sampling rate to corresponding estimated image data associated with a higher sampling rate. The method may include generating one or more estimated images based on the k-space data and the target neural network model. The one or more estimated images may correspond to a second sampling rate that exceeds the first sampling rate. Further, the method may include determining one or more target images based on the one or more estimated images and the k-space data using a compressed sensing model. The compressed sensing model may be constructed based on the one or more estimated images. For example, the compressed sensing model may include an objective function including a consistency term associated with the k-space data, and a regularization term associated with the one or more estimated images. The consistency term may represent a difference between candidate k-space data associated with one or more candidate images and the k-space data associated with MR signals acquired by the MR scanner. The regularization term may include a sparse transformation model associated with the one or more estimated images and one or more candidate images. One or more target images may be generated by performing a plurality of iterations based on the objective function until a condition is satisfied. Each iteration may include updating the one or more candidate images based on for example, the one or more estimated images.

Accordingly, the system may reconstruct the target MR image based on the k-space data obtained using an undersampling technique, which may shorten scan time. The system may generate the one or more estimated images using the target neural network model and reconstruct the target MR image using a compressed sensing technique based on the one or more estimated images. Generally, the compressed sensing technique may improve the speed of image reconstruction but cause loss of detail information in the target MR image. The one or more estimated images generated using the target neural network model may include more details used as a reference for the compressed sensing technique. A combination of the neural network model and the compressed sensing model may mitigate a loss of details in a reconstructed image and improve quality and accuracy of the reconstructed image.

Figure 1:
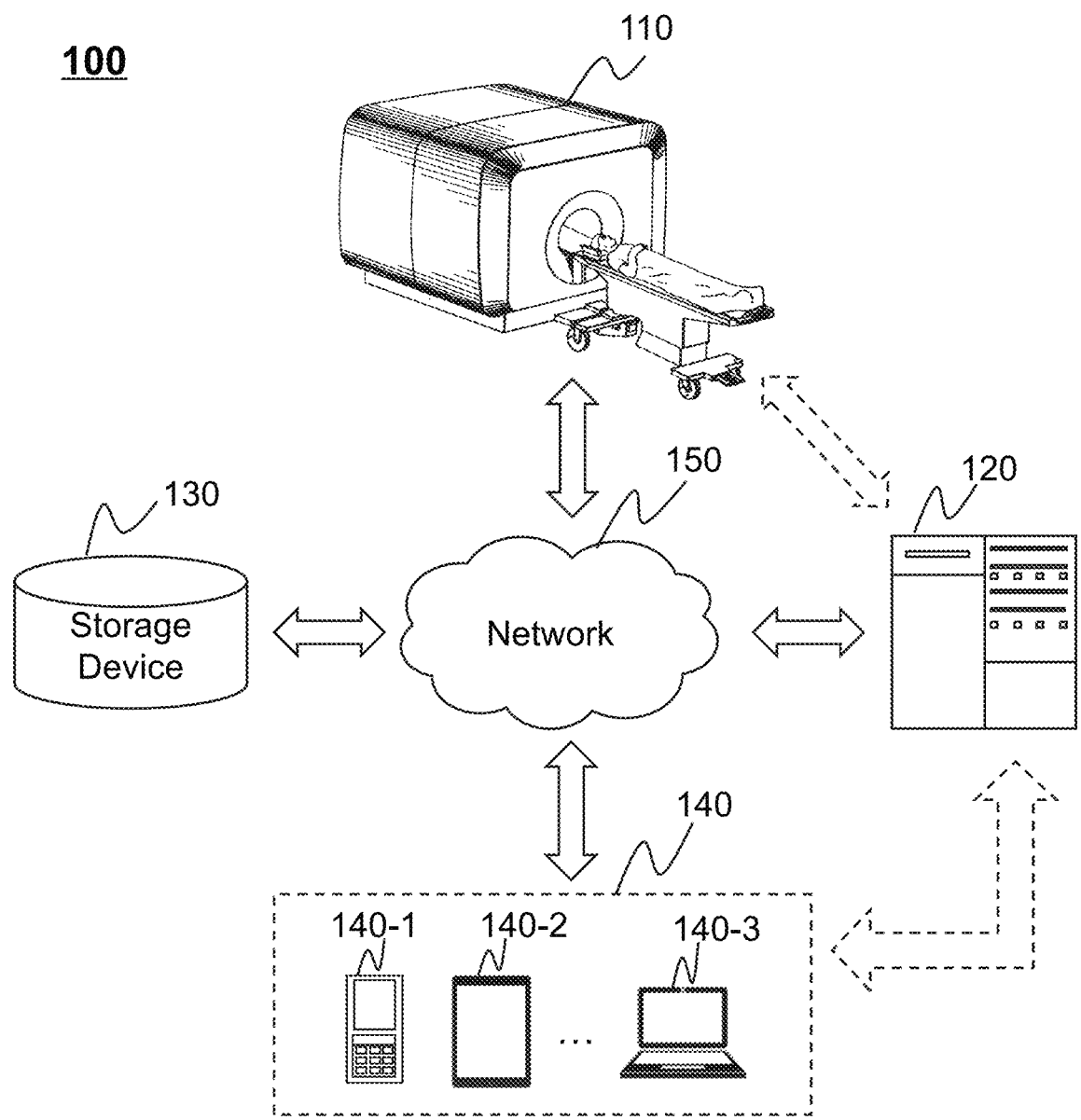
FIG. 1 is a schematic diagram illustrating an exemplary MRI system according to some embodiments of the present disclosure.

FIG. 1 is a schematic diagram illustrating an exemplary MRI system 100 (also referred to as imaging system 100 herein) according to some embodiments of the present disclosure. As illustrated, the MRI system 100 may include an MR scanner (or referred to as an MRI scanner) 110, a processing device 120, a storage device 130, one or more terminals 140, and a network 150. The components in the MRI system 100 may be connected in one or more of various ways. Merely by way of example, as illustrated in FIG. 1, the MR scanner 110 may be connected to the processing device 120 through the network 150. As another example, the MR scanner 110 may be connected with the processing device 120 directly as indicated by the bi-directional arrow in dotted lines linking the MR scanner 110 and the processing device 120. As a further example, the storage device 130 may be connected with the processing device 120 directly (not shown in FIG. 1) or through the network 150. As still a further example, one or more terminal(s) 140 may be connected with the processing device 120 directly (as indicated by the bi-directional arrow in dotted lines linking the terminal(s) 140 and the processing device 120) or through the network 150.

The MR scanner 110 may scan a subject or a portion thereof that is located within its detection region and generate MR signals relating to the (part of) subject. In the present disclosure, the terms "subject" and "object" are used interchangeably. In some embodiments, the subject may include a body, a substance, or the like, or a combination thereof. In some embodiments, the subject may include a specific portion of a body, such as the head, the thorax, the abdomen, or the like, or a combination thereof. In some embodiments, the subject may include a specific organ, such as the heart, the esophagus, the trachea, the bronchus, the stomach, the gallbladder, the small intestine, the colon, the bladder, the ureter, the uterus, the fallopian tube, etc. The MR scanner 110 may include a magnet assembly, a gradient coil assembly, and a radiofrequency (RF) coil assembly.

The magnet assembly may generate a first magnetic field (also referred to as a main magnetic field) for polarizing the subject to be scanned. The magnet assembly may include a permanent magnet, a superconducting electromagnet, a resistive electromagnet, etc.

The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated according to a pulse sequence. The RF receiver coils may acquire MR signals from the subject according to the pulse sequence. The pulse sequence may be defined by imaging parameters and arrangement associated with the image parameters in time sequence. For example, the pulse sequence may be defined by one or more parameters relating to time, such as a repetition time (TR), an acquisition time (TA), an echo time (TE), etc. Exemplary pulse sequences may include a spin echo sequence, a gradient echo sequence, a diffusion sequence, an inversion recovery sequence, or the like, or a combination thereof. For example, the spin echo sequence may include a fast spin echo (FSE), a turbo spin echo (TSE), a rapid acquisition with relaxation enhancement (RARE), a half-Fourier acquisition single-shot turbo spin-echo (HASTE), a turbo gradient spin echo (TGSE), or the like, or a combination thereof.

The MR signals may also be referred to as echo signals. The MR signals may be obtained based on a sampling technique. Exemplary sampling techniques may include a Cartesian sampling technique, a spiral sampling technique, a radial sampling technique, a Z-sampling technique, an undersampling technique, etc. Further, the MR signals may be processed using a transform operation (e.g., Fourier Transform) to fill a k-space to obtain the k-space data. In some embodiments, the MR signals may be sampled by the MR scanner 110 according to a sampling rate. As used herein, the sampling rate may be defined by a number (or count) of MR signals collected by the MR scanner 110 per second. The greater the count of the MR signals collected by the MR scanner 110 per second is, the higher the sampling rate may be. The sampling rate may relate to a time duration (i.e., scan time) needed for the execution of the pulse sequence, also referred to as the repetition time of the pulse sequence. The shorter the repetition time of the pulse sequence is, the greater the sampling rate may be.

In some embodiments, the MR scanner 110 may include an analog-to-digital converter (ADC) (not shown in FIG. 1). The analog-to-digital converter may convert MR signals received by one or more RF receiver coils into MR image data. The analog-to-digital converter may be a direct-conversion ADC, a successive-approximation ADC, a ramp-compare ADC, a Wilkinson ADC, an integrating ADC, a delta-encoded ADC, a pipeline ADC, a sigma-delta ADC, or the like, or a combination thereof.

The processing device 120 may process data and/or information obtained from the MR scanner 110, the terminal(s) 140, and/or the storage device 130. For example, the processing device 120 may obtain k-space data associated with MR signals corresponding to a first sampling rate obtained from the MR scanner 110. As another example, the processing device 120 may generate one or more estimated images based on the k-space data and a target neural network model. The one or more estimated images may correspond to a second sampling rate that exceeds the first sampling rate at which the k-space data is sampled based on the MR signals acquired by the MR scanner. As still an example, the processing device 120 may determine one or more target images based on the one or more estimated images and the k-space data using a compressed sensing model that is constructed based on the one or more estimated images. In some embodiments, a reconstructed image may be transmitted to the terminal(s) 140 and displayed on one or more display devices in the terminal(s) 140. In some embodiments, the processing device 120 may be a single server or a server group. The server group may be centralized or distributed. In some embodiments, the processing device 120 may be local or remote. For example, the processing device 120 may access information and/or data stored in the MR scanner 110, the terminal(s) 140, and/or the storage device 130 via the network 150. As another example, the processing device 120 may be directly connected with the MR scanner 110, the terminal(s) 140, and/or the storage device 130 to access stored information and/or data. In some embodiments, the processing device 120 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof. In some embodiments, the processing device 120 may be implemented on a computing device 200 having one or more components illustrated in FIG. 2 in the present disclosure.

The storage device 130 may store data and/or instructions. In some embodiments, the storage device 130 may store data obtained from the terminal(s) 140 and/or the processing device 120. For example, the storage device 130 may store MR signals obtained from the MR scanner 110 and k-space data associated with the MR signals. As another example, the storage device 130 may store a target neural network model and/or a compressed sensing model as described elsewhere in the present disclosure (e.g., FIG. 6 and the descriptions thereof). In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected with the network 150 to communicate with one or more components of the MRI system 100 (e.g., the processing device 120, the terminal(s) 140, etc.). One or more components of the MRI system 100 may access the data or instructions stored in the storage device 130 via the network 150. In some embodiments, the storage device 130 may be directly connected with or communicate with one or more components of the MRI system 100 (e.g., the processing device 120, the terminal(s) 140, etc.). In some embodiments, the storage device 130 may be part of the processing device 120.

The terminal(s) 140 may include a mobile device 140-1, a tablet computer 140-2, a laptop computer 140-3, or the like, or any combination thereof. In some embodiments, the mobile device 140-1 may include a smart home device, a wearable device, a smart mobile device, a virtual reality device, an augmented reality device, or the like, or any combination thereof. In some embodiments, the smart home device may include a smart lighting device, a control device of an intelligent electrical apparatus, a smart monitoring device, a smart television, a smart video camera, an interphone, or the like, or any combination thereof. In some embodiments, the wearable device may include a smart bracelet, smart footgear, a pair of smart glasses, a smart helmet, a smartwatch, smart clothing, a smart backpack, a smart accessory, or the like, or any combination thereof. In some embodiments, the smart mobile device may include a smartphone, a personal digital assistant (PDA), a gaming device, a navigation device, a point of sale (POS) device, or the like, or any combination thereof. In some embodiments, the virtual reality device and/or the augmented reality device may include a virtual reality helmet, a virtual reality glass, a virtual reality patch, an augmented reality helmet, an augmented reality glass, an augmented reality patch, or the like, or any combination thereof. For example, the virtual reality device and/or the augmented reality device may include a Google Glass, an Oculus Rift, a Hololens, a Gear VR, etc. In some embodiments, the terminal(s) 140 may remotely operate the MR scanner 110. In some embodiments, the terminal(s) 140 may operate the MR scanner 110 via a wireless connection. In some embodiments, the terminal(s) 140 may receive information and/or instructions inputted by a user, and send the received information and/or instructions to the MR scanner 110 or the processing device 120 via the network 150. In some embodiments, the terminal(s) 140 may receive data and/or information from the processing device 120. In some embodiments, the terminal(s) 140 may be part of the processing device 120. In some embodiments, the terminal(s) 140 may be omitted.

In some embodiments, the terminal(s) 140 may send and/or receive information for MR image reconstruction to the processing device 120 via a user interface. The user interface may be in the form of an application for MR image reconstruction implemented on the terminal(s) 140. The user interface implemented on the terminal(s) 140 may be configured to facilitate communication between a user and the processing device 120. In some embodiments, a user may input a request for MR image reconstruction via the user interface implemented on a terminal 140. The terminal(s) 140 may send the request for MR image reconstruction to the processing device 120 for reconstructing an MR image based on a target neural network model and a compressed sensing model as described elsewhere in the present disclosure (e.g., FIG. 6 and the descriptions thereof). In some embodiments, the user may input and/or adjust parameters (e.g., weights) of the target neural network model and/or parameters (e.g., a regularization term, etc.) of the compressed sensing model via the user interface. In some embodiments, the user interface may facilitate the presentation or display of information and/or data (e.g., a signal) relating to MR image reconstruction received from the processing device 120. For example, the information and/or data may include a result generated by the processing device 120 in an image reconstruction. For example, the result may include one or more images (e.g., 2D images, 3D images, etc.), one or more data figures, one or more words, one or more digits, one or more models for MR image reconstruction, parameters used in such image reconstruction, etc. In some embodiments, the information and/or data may be further configured to cause the terminal(s) 140 to display the result to the user.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, or the storage device 130) may communicate information and/or data with one or more other components of the MRI system 100 via the network 150. For example, the processing device 120 may obtain MR signals from the MR scanner 110 via the network 150. As another example, the processing device 120 may obtain user instructions from the terminal(s) 140 via the network 150. In some embodiments, the network 150 may be any type of wired or wireless network, or a combination thereof. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

The network 150 may include any suitable network that can facilitate the exchange of information and/or data for the MRI system 100. In some embodiments, one or more components of the MRI system 100 (e.g., the MR scanner 110, the terminal(s) 140, the processing device 120, the storage device 130, etc.) may transmit or receive information and/or data with one or more other components of the MRI system 100 via the network 150. For example, the processing device 120 may obtain image data from the MR scanner 110 via the network 150. As another example, the processing device 120 may obtain user instructions from the terminal(s) 140 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, and/or any combination thereof. Merely by way of example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected with the network 150 to exchange data and/or information.

FIG. 2 is a schematic diagram illustrating hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (program code) and perform functions of the processing device 120 in accordance with techniques described herein. The computer instructions may include, for example, routines, programs, objects, components, signals, data structures, procedures, modules, and functions, which perform particular functions described herein. For example, the processor 210 may process data obtained from the MR scanner 110, the terminal(s) 140, the storage device 130, and/or any other component of the imaging system 100. Specifically, the processor 210 may process one or more measured data sets obtained from the MR scanner 110. For example, the processor 210 may reconstruct an image based on the data set(s). In some embodiments, the reconstructed image may be stored in the storage device 130, the storage 220, etc. In some embodiments, the reconstructed image may be displayed on a display device by the I/O 230. In some embodiments, the processor 210 may perform instructions obtained from the terminal(s) 140. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage 220 may store data/information obtained from the MR scanner 110, the terminal(s) 140, the storage device 130, or any other component of the imaging system 100. In some embodiments, the storage 220 may include a mass storage device, a removable storage device, a volatile read-and-write memory, a read-only memory (ROM), or the like, or any combination thereof. For example, the mass storage may include a magnetic disk, an optical disk, a solid-state drive, etc. The removable storage may include a flash drive, a floppy disk, an optical disk, a memory card, a zip disk, a magnetic tape, etc. The volatile read-and-write memory may include a random access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (PEROM), an electrically erasable programmable ROM (EEPROM), a compact disk ROM (CD-ROM), and a digital versatile disk ROM, etc. In some embodiments, the storage 220 may store one or more programs and/or instructions to perform exemplary methods described in the present disclosure. For example, the storage 220 may store a program for the processing device 120 for reducing or removing one or more artifacts in an image.

The I/O 230 may input or output signals, data, and/or information. In some embodiments, the I/O 230 may enable user interaction with the processing device 120. In some embodiments, the I/O 230 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof. Exemplary display devices may include a liquid crystal display (LCD), a light-emitting diode (LED)-based display, a flat panel display, a curved screen, a television device, a cathode ray tube (CRT), or the like, or a combination thereof.

The communication port 240 may be connected with a network (e.g., the network 150) to facilitate data communications. The communication port 240 may establish connections between the processing device 120 and the MR scanner 110, the terminal(s) 140, or the storage device 130. The connection may be a wired connection, a wireless connection, or a combination of both that enables data transmission and reception. The wired connection may include an electrical cable, an optical cable, a telephone wire, or the like, or any combination thereof. The wireless connection may include Bluetooth, Wi-Fi, WiMax, WLAN, ZigBee, mobile network (e.g., 3G, 4G, 5G, etc.), or the like, or a combination thereof. In some embodiments, the communication port 240 may be a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
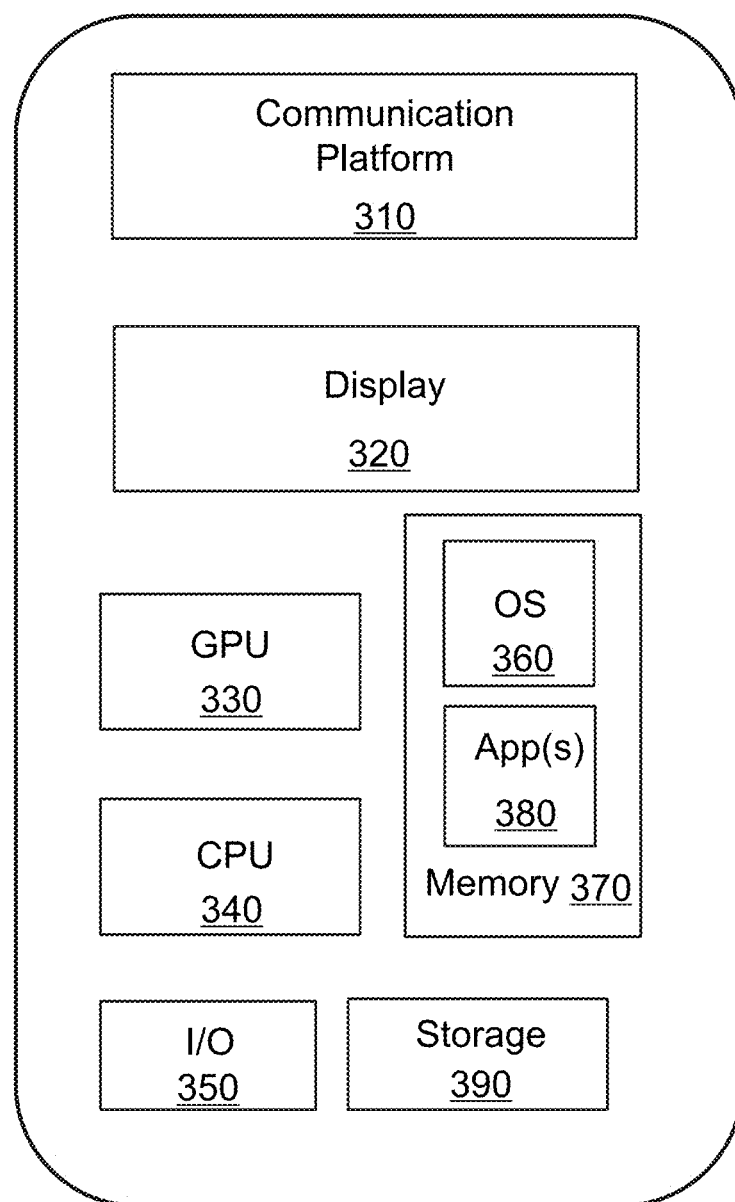
FIG. 3 is a schematic diagram illustrating hardware and/or software components of an exemplary mobile device according to some embodiments of the present disclosure.

FIG. 3 is a schematic diagram illustrating hardware and/or software components of an exemplary mobile device 300 according to some embodiments of the present disclosure. As illustrated in FIG. 3, the mobile device 300 may include a communication platform 310, a display 320, a graphics processing unit (GPU) 330, a central processing unit (CPU) 340, an I/O 350, a memory 370, and a storage 390. In some embodiments, any other suitable component, including but not limited to a system bus or a controller (not shown), may also be included in the mobile device 300. In some embodiments, a mobile operating system 360 (e.g., iOS, Android, Windows Phone, etc.) and one or more applications 380 may be loaded into the memory 370 from the storage 390 in order to be executed by the CPU 340. The applications 380 may include a browser or any other suitable mobile apps for receiving and rendering information relating to image processing or other information from the processing device 120. User interactions with the information stream may be achieved via the I/O 350 and provided to the processing device 120 and/or other components of the imaging system 100 via the network 150.

To implement various modules, units, and their functionalities described in the present disclosure, computer hardware platforms may be used as the hardware platform(s) for one or more of the elements described herein. The hardware elements, operating systems and programming languages of such computers are conventional in nature, and it is presumed that those skilled in the art are adequately familiar therewith to adapt those technologies to generate an image as described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result, the drawings should be self-explanatory.

Figure 4:
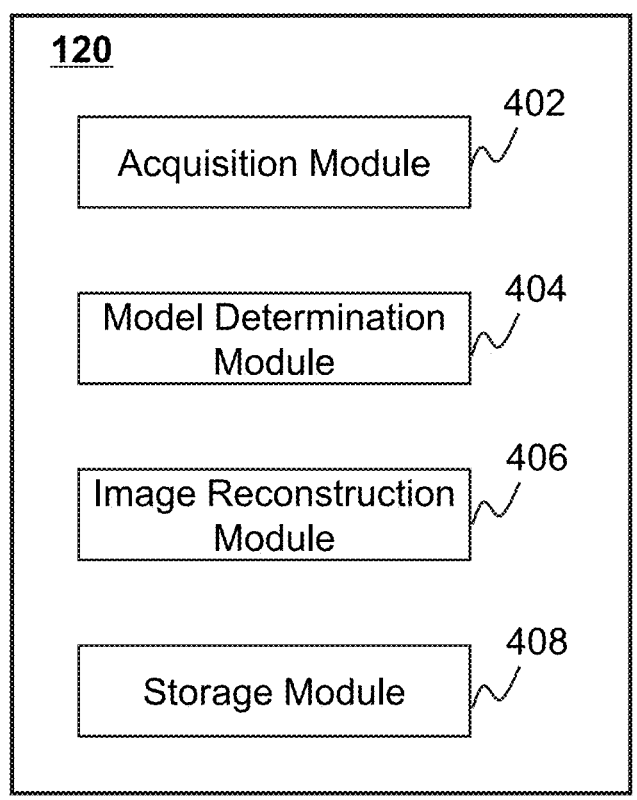
FIG. 4 is a block diagram illustrating an exemplary processing device according to some embodiments of the present disclosure.

FIG. 4 is a block diagram illustrating an exemplary processing device 120 according to some embodiments of the present disclosure. The processing device 120 may include an acquisition module 402, a model determination module 404, an image reconstruction module 406, and a storage module 408. At least a portion of the processing device 120 may be implemented on a computing device as illustrated in FIG. 2 or a mobile device as illustrated in FIG. 3.

The acquisition module 402 may obtain image data. The acquisition module 402 may obtain the image data from the MRI system 100 and/or a storage device (e.g., the storage device 130, the storage 220, the storage 390). In some embodiments, the image data may include k-space data, images, etc. The k-space data may be associated with MR signals acquired by an MR scanner (e.g., the MR scanner 110) scanning a subject (e.g., a substance, an organ, a tissue, etc.). In some embodiments, the k-space data may be generated by filling a k-space using the MR signals.

In some embodiments, the acquisition module 402 may send the image data to other modules and/or units of the processing device 120 for further processing. For example, the image data may be sent to the storage module 408 for storage. For another example, the acquisition module 402 may send the image data (e.g., the scanning data) to the image reconstruction module 406 for reconstructing an image.

The model determination module 404 may determine one or more neural network models. For example, the model determination module 404 may determine a target neural network model configured to, for example, generate one or more estimated images based on the k-space data obtained by the acquisition module 402. The target neural network model may map image data associated with a lower sampling rate to corresponding estimated image data associated with a higher sampling rate. In some embodiments, the model determination module 404 may transmit a determined target neural network model to one or more other modules for further processing or application. For example, the model determination module 404 may transmit a target neural network model to the storage module 408 for storage. As another example, the model determination module 404 may transmit a target neural network model to the image reconstruction module 406 for image processing.

The image reconstruction module 406 may process information provided by various modules of the processing device 120. The image reconstruction module 406 may process image data acquired by the acquisition module 402, image data retrieved from the storage module 408, etc. In some embodiments, the image reconstruction module 406 may reconstruct an image based on the image data according to a reconstruction technique, generate a report including one or more images and/or other related information, and/or perform any other function for image reconstruction in accordance with various embodiments of the present disclosure.

The image reconstruction module 406 may reconstruct one or more intermediate images based on the k-space data obtained by the acquisition module 402 using an MR image reconstruction technique. Exemplary MR image reconstruction techniques may include a 2-dimensional Fourier transform technique, a back projection technique (e.g., a convolution back projection technique, a filtered back projection technique), an iteration reconstruction technique, etc. Exemplary iteration reconstruction techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof.

The image reconstruction module 406 may generate one or more estimated images based on the k-space data and a target neural network model determined by the model determination module 404. For example, the intermediate images may be inputted to the target neural network model. The one or more estimated images may be generated by the target neural network model based on the inputted intermediate images. The image reconstruction module 406 may also reconstruct one or more target images based on the k-space data using a compressed sensing model constructed based on the one or more estimated images.

The storage module 408 may store information. The information may include programs, software, algorithms, neural network models, image data, control parameters, processed image data, or the like, or a combination thereof. For example, the information may include k-space data, one or more estimated images, one or more target images, a target neural network model, a compressed sensing model, etc. In some embodiments, the storage module 408 may store one or more programs and/or instructions that may be executed by the processor(s) of the processing device 120 to perform exemplary methods described in this disclosure. For example, the storage module 408 may store program(s) and/or instruction(s) that can be executed by the processor(s) of the processing device 120 to acquire image data, reconstruct an image based on the image data, train a neural network model, and/or display any intermediate result or a resultant image.

In some embodiments, one or more modules illustrated in FIG. 4 may be implemented in at least part of the exemplary MRI system 100 as illustrated in FIG. 1. For example, the acquisition module 402, the storage module 408, the model determination module 404, and/or the image reconstruction module 406 may be integrated into a console (not shown). Via the console, a user may set parameters for scanning a subject, controlling imaging processes, controlling parameters for reconstruction of an image, viewing reconstructed images, etc. In some embodiments, the console may be implemented via the processing device 120 and/or the terminals 140. In some embodiments, the model determination module 404 may be integrated into the terminals 140.

In some embodiments, the processing device 120 does not include the model determination module 404. One or more target neural network models determined by another device may be stored in the MRI system 100 (e.g., the storage device 130, the storage 220, the storage 390, the memory 370, the storage module 408, etc.) or in an external device accessible by the processing device 120 via, for example, the network 150. In some embodiments, such a device may include a portion the same as or similar to the model determination module 404. In some embodiments, the model determination module 404 may store one or more target neural network models determined by another device and be accessible by one or more components of the MRI system 100 (e.g., the image reconstruction module 406, etc.). In some embodiments, a target neural network model applicable in the present disclosure may be determined by the MRI system 100 (or a portion thereof including, e.g., the processing device 120) or an external device accessible by the MRI system 100 (or a portion thereof including, e.g., the processing device 120) following the processes disclosure herein.

Figure 5:
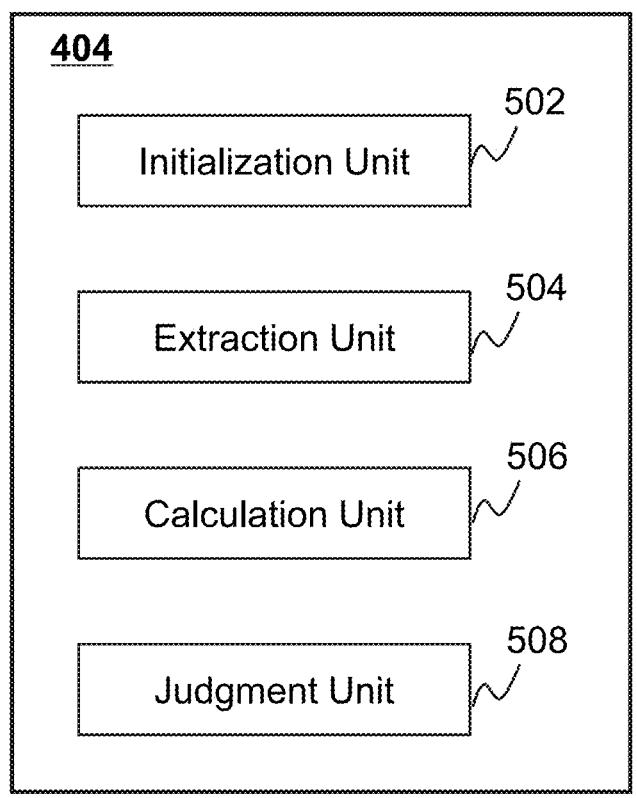
FIG. 5 is a block diagram illustrating an exemplary model determination module according to some embodiments of the present disclosure.

FIG. 5 is a block diagram illustrating an exemplary model determination module 404 according to some embodiments of the present disclosure. As shown, the model determination module 404 may include an initialization unit 502, an extraction unit 504, a calculation unit 506, and a judgment unit 508. The model determination module 404 may be implemented on various components (e.g., the processor 210 of the computing device 200 as illustrated in FIG. 2). For example, at least a portion of the model determination module 404 may be implemented on a computing device as illustrated in FIG. 2 or a mobile device as illustrated in FIG. 3. In some embodiments, the model determination module 404 may be separated from the processing device 120 or the MRI system 100. The model determination module 404 may train a neural network model and transfer a trained neural network model to the processing device 120, the MRI system 100, or any other storage.

The initialization unit 502 may initialize a neural network model. For example, the initialization unit 502 may construct a neural network model. The neural network model may be constructed based on at least one of a convolutional neural network model (CNN), a fully convolutional neural network (FCN) model, a generative adversarial network (GAN), a back propagation (BP) neural network model, a radial basis function (RBF) neural network model, a deep belief nets (DBN) neural network model, an Elman neural network model, or the like, or a combination thereof. As another example, the initialization unit 502 may initialize one or more parameter values of the neural network model. The extraction unit 504 may extract information from multiple groups of training data (e.g., undersampling image data, reference image data corresponding to the undersampling image data, etc.). For example, the extraction unit 504 may extract features regarding one or more regions from the training images. The calculation unit 506 may perform a calculation function in a process for, for example, training a neural network model. For example, the calculation unit 506 may calculate one or more parameter values (e.g., values of a cost function) of an updated neural network model generated in an iterative training process. The judgment unit 508 may perform a judgment function in a process for, for example, training a neural network model. For example, the judgment unit 508 may determine whether a condition (e.g., a termination condition) is satisfied in a training process of a neural network model.

It should be noted that the above description of the model determination module 404 is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, the judgment unit 508 and the calculation unit 506 may be integrated into one single unit.

Figure 6:
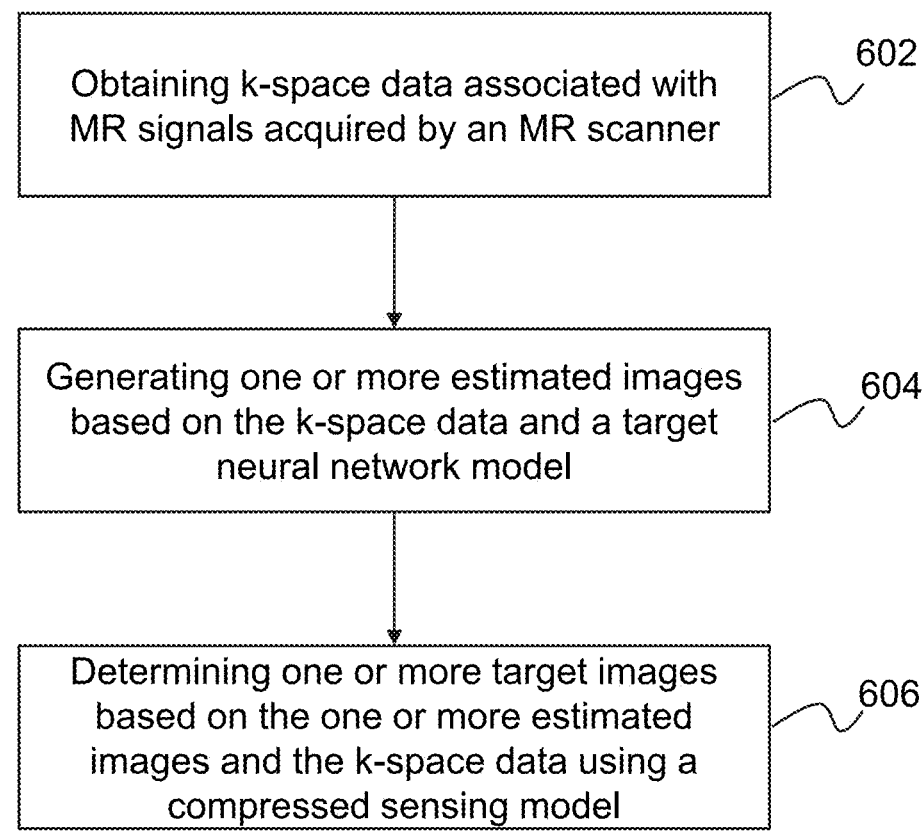
FIG. 6 is a flowchart illustrating an exemplary process for reconstructing one or more MR images according to some embodiments of the present disclosure.

FIG. 6 is a flowchart illustrating an exemplary process 600 for reconstructing one or more MR images according to some embodiments of the present disclosure. In some embodiments, one or more operations of process 600 illustrated in FIG. 6 may be implemented in the MRI system 100 illustrated in FIG. 1. For example, process 600 illustrated in FIG. 6 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3).

In 602, k-space data associated with MR signals acquired by an MR scanner may be obtained. Operation 602 may be performed by the acquisition module 402. In some embodiments, the k-space data may be obtained from the MR scanner 110, the processing device 120, one or more storage devices disclosed in the present disclosure (e.g., the storage device 130), etc. For example, the k-space data may be generated by the processing device 120 by filling a k-space using the MR signals. The MR signals may be acquired by an MR scanner (e.g., the MR scanner 110) by way of scanning a subject (e.g., a substance, an organ, a tissue, etc.) based on one or more pulse sequences as described elsewhere in the present disclosure (e.g., FIG. 1 and the descriptions thereof). For example, the MR signals relating to the head of a patient may be acquired based on a set of pulse sequences including a T1 flair pulse sequence, a T2 flair pulse sequence, a T2 pulse sequence, or the like, or a combination thereof. The set of pulse sequences may correspond to different sampling rates and repetition times. For example, the repetition time associated with the T2 pulse sequence may exceed the repetition time associated with each of the T1 flair pulse sequence and the T2 flair pulse sequence. The sampling rate associated with the T2 pulse sequence may exceed the sampling rate associated with each of the T1 flair pulse sequence and the T2 flair pulse sequence. The one or more pulse sequences may be set by a user or according to a default setting of the MRI system 100.

In some embodiments, the k-space data may correspond to a first sampling rate. The first sampling rate may be set by a user or according to a default setting of the MRI system 100. For example, the first sampling rate may be set according to the one or more pulse sequences. In some embodiments, the k-space data may be acquired based on an undersampling technique. The first sampling rate associated with the k-space data acquired based on the undersampling technique may be different from the sampling rate according to the Nyquist sampling theorem. The k-space data acquired based on an undersampling technique may also be referred to as undersampling k-space data associated with the first sampling rate (i.e., a sampling rate lower than the sampling rate according to the Nyquist sampling theorem). In some embodiments, using the undersampling technique, an undersampling pattern may be used to design the one or more pulse sequences for scanning the subject. Sampling points distributed on the undersampling pattern may be regular or random. For example, for a regular undersampling pattern, the sampling density at the center region of a k-space is higher than that at the edge region of the k-space. As used herein, the sampling density of the k-space may refer to a count of sampling points per unit area of the k-space or a portion of the k-space. In some embodiments, for the regular undersampling pattern, the center region of the k-space may be fully sampled, and the remaining region of the k-space may be undersampled.

In 604, one or more estimated images may be generated based on the k-space data and a target neural network model. Operation 604 may be performed by the image reconstruction module 406. The one or more estimated images may correspond to a second sampling rate that exceeds the first sampling rate at which the MR signals acquired by the MR scanner 110 are sampled to determine the k-space data. The second sampling rate may also be referred to as a higher sampling rate relative to the first sampling rate. As used herein, the second sampling rate may also be referred to as an equivalent sampling rate associated with an estimated image. The equivalent sampling rate may refer to a sampling rate required by estimated k-space data that is used to reconstruct the estimated image.

The target neural network model may be configured to map first image data (e.g., the k-space data obtained in 602) to corresponding estimated first image data (e.g., the one or more estimated images generated in 604). A sampling rate associated with the corresponding estimated first image data may exceed a sampling rate associated with the first image data. As used herein, image data may include k-space data in the frequency domain, images in the spatial domain, etc. For example, the first image data may include first k-space data in the frequency domain or a first MR image in the spatial domain corresponding to the first k-pace data in the frequency domain. The estimated first image data may be in the frequency domain or spatial domain. For example, the estimated first image data may include estimated first k-space data in the frequency domain or an estimated first MR image in the spatial domain corresponding to the estimated first k-pace data in the frequency domain. In some embodiments, the first image data may include undersampling k-space data, undersampling images, etc. The second image data may include fully sampled k-space data corresponding to the undersampling k-space data, fully sampled images corresponding to the undersampling images, etc.

In some embodiments, the k-space data corresponding to the first sampling rate obtained in 602 may be inputted to the target neural network model. The estimated k-space data may be generated by the target neural network model based on the inputted k-space data obtained in 602. The estimated k-space data may correspond to the second sampling rate exceeding the first sampling rate. The one or more estimated images may be reconstructed based on the estimated k-space data using an MR image reconstruction technique. Exemplary MR image reconstruction techniques may include a 2-dimensional Fourier transform technique, a back projection technique (e.g., a convolution back projection technique, a filtered back projection technique), an iteration reconstruction technique, etc. Exemplary iteration reconstruction techniques may include an algebraic reconstruction technique (ART), a simultaneous iterative reconstruction technique (SIRT), a simultaneous algebraic reconstruction technique (SART), an adaptive statistical iterative reconstruction (ASIR) technique, a model-based iterative reconstruction (MBIR) technique, a sinogram affirmed iterative reconstruction (SAFIR) technique, or the like, or any combination thereof.

In some embodiments, one or more intermediate images may be reconstructed based on the k-space data obtained in 602 using an MR image reconstruction technique as exemplified above. The one or more intermediate images may be inputted to the target neural network model. The one or more estimated images may be generated by the target neural network model based on the inputted intermediate images. In some embodiments, each of the one or more intermediate images may be inputted to the target neural network model individually. Therewith the one or more estimated images may be generated by the target neural network model individually. In some embodiments, the one or more intermediate images may be inputted to the target neural network model together as a sequence or a batch. Therewith the one or more estimated images may be generated by the target neural network model together as a sequence or a batch of estimated images. In some embodiments, the k-space data corresponding to the first sampling rate obtained in 602 may be inputted to the target neural network model. The one or more estimated images may be generated by the target neural network model based on the inputted k-space data obtained in 602.

The target neural network model may be obtained from the model determination module 404, the storage device 130, or any other storage device. For example, the model determination module 404 may generate the target neural network model by training a neural network model (e.g., a neural network model) using multiple groups of training data based on a model training algorithm. Exemplary neural network models may include a convolutional neural network model (CNN), a fully convolutional neural network (FCN) model, a generative adversarial network (GAN), a back propagation (BP) neural network model, a radial basis function (RBF) neural network model, a deep belief nets (DBN) neural network model, an Elman neural network model, or the like, or a combination thereof. Exemplary model training algorithms may include a gradient descent algorithm, a Newton's algorithm, a Quasi-Newton algorithm, a Levenberg-Marquardt algorithm, a conjugate gradient algorithm, or the like, or a combination thereof. Each group of the multiple groups of training data may include second image data and reference second image data corresponding to the second image data. A sampling rate associated with the reference second image data may exceed a sampling rate associated with the second image data. During a training process of the neural network model, the mapping relationship between the first image data associated with a lower sampling rate and the corresponding estimated first image data associated with a higher sampling rate may be established based on the plurality of groups of training data, and the trained neural network model may be determined as the target neural network model. The target neural network model may be generated according to the exemplary process for training a neural network model disclosed elsewhere in the present disclosure (e.g., FIGS. 8-9, the process 800 and the process 900).

In 606, one or more target images may be determined based on the one or more estimated images and the k-space data using a compressed sensing model. Operation 606 may be performed by the image reconstruction module 406. The compressed sensing model may be constructed based on the k-space data obtained in 602 and/or the one or more estimated images determined in 604. In some embodiments, using the compressed sensing model, an objective function may be determined based on the one or more estimated images and the k-space data. The one or more target images may be reconstructed based on the compressed sensing model using an iteration technique. For example, the one or more target images may be determined by performing one or more iterations based on the objective function. In each iteration, one or more candidate images may be determined. A value of the objective function may be determined based on the one or more candidate images, the k-space data, and the one or more estimated images. The value of the objective function after each iteration may be updated based on updated candidate images obtained in a most recent iteration. One or more specific candidate images may be determined as the one or more target images by performing the plurality of iterations based on the objective function until a condition is satisfied. Each of the one or more estimated images may correspond to one of the one or more target images and one of the one or more candidate images. In some embodiments, the condition may be such that the change in values of the objective function in the two or more consecutive iterations may be equal to or smaller than a threshold. The threshold may be set by a user (e.g., a doctor) or according to a default setting of the MRI system 100. In some embodiments, the condition may be such that the total times of the plurality of iterations may be equal to or larger than a preset threshold. In some embodiments, the condition may be such that the value of the objective function is maximum or minimum locally or globally.

The objective function may be constructed based on the one or more estimated images and the k-space data obtained in 602. The objective function may include a consistency term associated with the k-space data, and a regularization term associated with the one or more estimated images. The consistency term may represent a difference between candidate k-space data associated with one or more candidate images and the k-space data obtained in 602. More descriptions regarding the consistency term may be found elsewhere in the disclosure. See, e.g., FIG. 7 and the descriptions thereof.

The regularization term may be constructed based on the one or more estimated images. In some embodiments, the regularization term may include a sparse transformation model associated with the one or more estimated images and one or more candidate images. The sparse transformation model may be constructed based on L0-norm, L1-norm, etc. The sparse transformation model may include a differential operation function, a total variation (TV) operation function, a Markov random field (MRF) function, an Autoregressive model, a wavelet transform function, a discrete cosine transform (DCT) function, or the like, or a combination thereof. For example, the sparse transformation model may include a differential operation function. The differential operation function may include a weight operator in the spatial domain associated with a confidence level of the one or more estimated images or in the frequency domain associated with a confidence level of at least one portion of space data of the one or more estimated images. In some embodiments, the regularization term may be configured to constrain a difference between the one or more candidate images and the one or more estimated images. For example, the regularization term may be constructed based on L2-norm configured to constrain the difference between the one or more candidate images and the one or more estimated images using a sum of squared difference between the one or more candidate images and the one or more estimated images. As another example, the regularization term may be constructed based on L1-norm configured to constrain the difference between the one or more candidate images and the one or more estimated images using a sum of absolute difference between the one or more candidate images and the one or more estimated images.

In some embodiments, the objective function may also include one or more additional regularization terms. For example, the objective function may also include an additional regularization term configured to constrain sparsity of one of the one or more candidate images. As another example, the objective function may also include an additional regularization term constructed based on a TV operation function associated with one of the one or more candidate images. More descriptions of the objective function and the determination of one or more target images may be found elsewhere in the present disclosure (e.g., FIG. 7, and the descriptions thereof).

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, in operation 604, the one or more estimated images may be generated based on the k-space data and a target machine learning model. The target machine learning model may be configured to map the first image data (e.g., the k-space data obtained in 602) to corresponding estimated first image data (e.g., the one or more estimated images generated in 604) as described elsewhere in the present disclosure. The target machine learning model may be obtained by training a machine learning model, such as a regression model, a k-means model, etc., using the multiple groups of training data as described elsewhere in the present disclosure.

Figure 7:
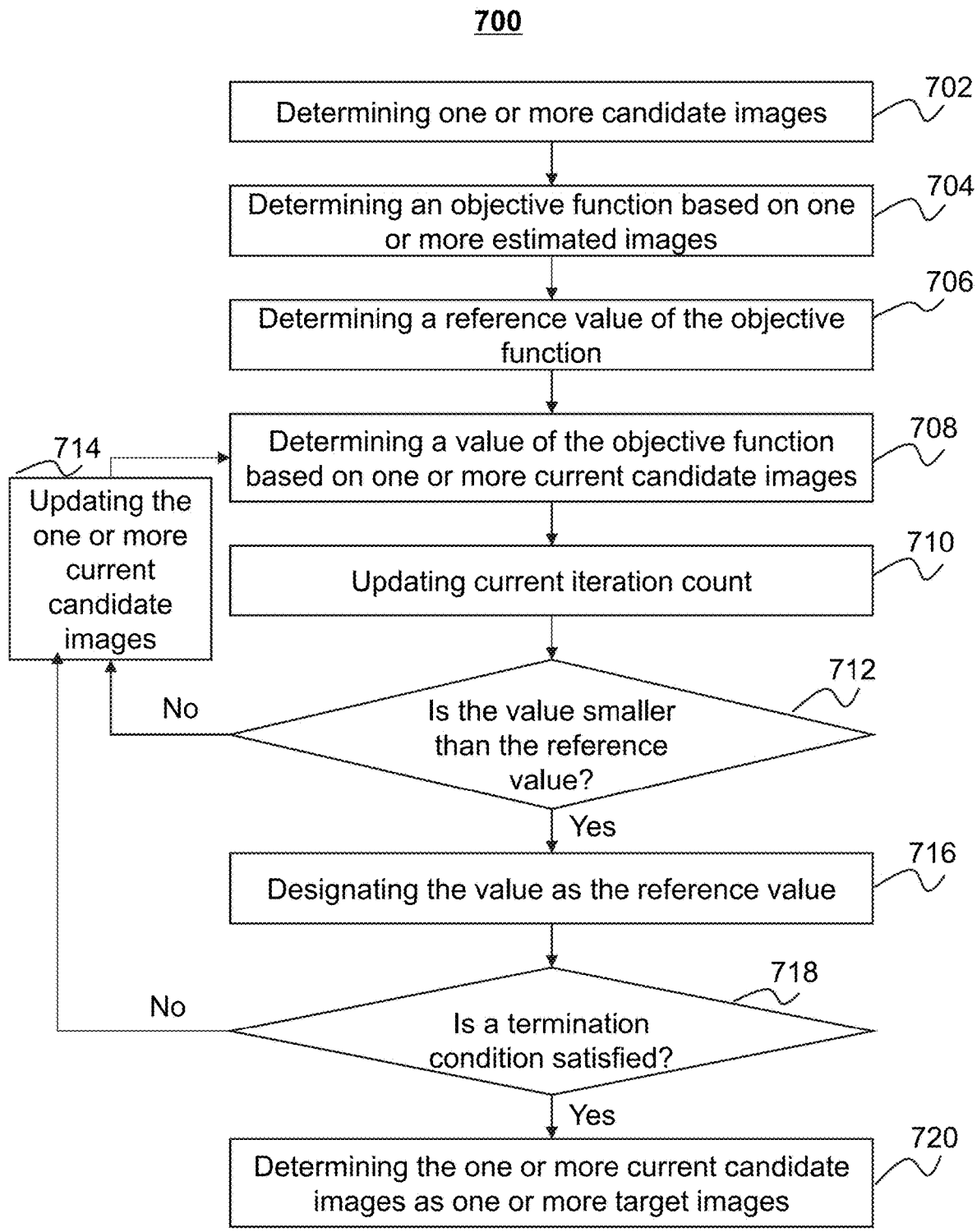
FIG. 7 is a flowchart illustrates an exemplary process for determining an MR image using a compressed sensing model according to some embodiments of the present disclosure.

FIG. 7 is a flowchart illustrates an exemplary process 700 for determining an MR image using a compressed sensing model according to some embodiments of the present disclosure. In some embodiments, one or more operations of process 700 illustrated in FIG. 7 may be implemented in the MRI system 100 illustrated in FIG. 1. For example, process 700 illustrated in FIG. 7 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3). In some embodiments, operation 606 illustrated in FIG. 6 may be performed according to the process 700. Process 700 may be an iterative process including one or more iterations. At least one portion of operations (e.g., operations 708 to 716) in process 700 may be performed in each of the plurality of iterations. In some embodiments, an initial iteration count may be set to 0 or 1.

In 702, one or more candidate images may be determined. Operation 702 may be performed by the image reconstruction module 406. The one or more candidate images determined in operation 702 may also be referred to as one or more initial candidate images for the iterative process. In some embodiments, the one or more initial candidate images may constitute an initial candidate image sequence. The one or more initial candidate images may be the same with or different from each other. In some embodiments, a candidate image may include a plurality of pixels or voxels with estimated characteristics, e.g., luminance values, gray values, colors (or RGB values), saturation values, etc. In some embodiments, the one or more initial candidate images may be set by a user or according to a default setting of the MRI system 100. For example, the gray values of pixels or voxels in an initial candidate image may be set as different values or the same value. In some embodiments, the one or more candidate image may be determined based on the one or more estimated images determined as described in operation 604. For example, one of the one or more estimated images may be designated as the one or more candidate images. As another example, each of the one or more estimated images may be designated as one of the one or more candidate images.

In 704, an objective function may be determined based on one or more estimated images. Operation 704 may be performed by the image reconstruction module 406. As used herein, the objective function may be used to determine one or more target images (also referred to as an "optimal solution"). In some embodiments, the one or more candidate images may be determined as one of the one or more target images based on a result of the determination that a value of the objective function corresponding to the one or more candidate images satisfies a condition. For instance, the condition may be that the value of the objective function is smaller than or equal to a threshold. As another example, the condition may be that a value of the objective function corresponding to the candidate image is minimum locally or globally.

In some embodiments, the objective function may be determined based on a compressed sensing model. For instance, the compressed sensing model may be used to generate one or more target images when an extremum (e.g., a maximum, a minimum) is reached for the objective function. The objective function may include a consistency term associated with the k-space data obtained as described in operation 602, and a regularization term associated with the one or more estimated images determined as described in operation 604. The consistency term may represent a difference between candidate k-space data associated with the one or more candidate images and the k-space data. The candidate k-space data may be determined based on a Fourier Transform associated with the one or more candidate images. The consistency term may be configured to constrain the candidate k-space data associated with the one or more candidate images to similar to or the same as the k-space data obtained by scanning a subject using an MR scanner, that is also referred to as actual k-space data (e.g., the undersampling k-space data with a lower sampling rate as described in 602). In some embodiments, the consistency term may be constructed by L2-norm representing the distance (i.e., difference) between the candidate k-space data associated with one or more candidate images and the k-space data. The regularization term may be constructed based on L1 norm representing a sparse transformation model associated with the one or more candidate images and the one or more estimated images. The one or more estimated images may be obtained as described elsewhere in the present disclosure (e.g., FIG. 6 and the descriptions thereof). The sparse transformation model may denote sparsity associated with the one or more estimated images and the one or more candidate images. As used herein, the sparsity of a specific image means that in the frequency domain, only a few signals or coefficients associated with the specific image are important components, and the remaining signals are zero or relatively small, for example, 1% or less of the maximum intensity of signals associated with the specific image.

In some embodiments, the objective function may be denoted by Equation (1) as follows:

$$\min_s \{\|y - \Theta s\|_2^2 + \lambda_1 \|T(s_{pred}, s)\|_1 + \lambda_2 \|\psi s\|_1\}, \quad (1)$$

where s refers to one or more candidate images generated in each iteration, y refers to actual k-space data (e.g., the k-space data obtained in 602), $s_{pred}$ refers to one or more estimated images (e.g., the one or more estimated images as described in operation 604 that correspond to a higher sampling rate than the sampling rate corresponding to the k-space data as described in operation 602), $T(s_{pred}, s)$ refers to the sparse transformation model, $\lambda_1$ refers to a first scalar factor, $\lambda_2$ refers to a second scalar factor, $\psi$ refers to a sparse transform operation (e.g., a wavelet transform), and $\Theta$=UF. U refers to an undersampling pattern denoted by a matrix including a plurality of elements. The values of the plurality of elements may be 0 (i.e., data is unsampled) or 1 (i.e., data is sampled), and F refers to Fourier transform. The first scalar factor $\lambda_1$, and/or the second scalar factor $\lambda_2$ may be configured to control a punishment intensity of the objective function. The undersampling pattern, the first scalar factor $\lambda_1$, and/or the second scalar factor $\lambda_2$ may be set by a user according to a clinical demand or a default setting of the MRI system 100. For example, the first scalar factor $\lambda_1$ and/or the second scalar factor $\lambda_2$ may be a constant in a range from 0 to 2, or from 0 to 1, etc.

In some embodiments, the sparse transformation model may be constructed based on a differential operation function. The differential operation function may be configured to constrain a difference between the one or more estimated images and the one or more candidate images. The differential operation function may include a weight operator in the spatial domain associated with a confidence level of the one or more estimated images or in the frequency domain associated with a confidence level of at least one portion of estimated space data of the one or more estimated images. The estimated space data of the one or more estimated images being acquired by performing Fourier Transform on the one or more estimated images. For example, the sparse transformation model may be denoted by Equation (2) as follows:

$$T(s_{pred}, s) = |W(s_{pred} - s)| \quad (2),$$

where W refers to a weight function or operator. The weight function W may include a plurality of weight factors in the frequency domain or spatial domain. The sparse transformation model may be constructed by performing a dot multiplication operation between W and the difference between the one or more candidate images and the one or more estimated images. In some embodiments, W may be determined by evaluating the confidence level of the one or more estimated images. A region in the one or more estimated images with a higher confidence level may be assigned with a larger weigh factor. A region in the one or more estimated images with a lower confidence level may be assigned with a smaller weight value. As used herein, the confidence level of a region in an estimated image may be used to represent a difference between characteristics of a position or portion of a subject and those as presented in the estimated image. The greater the difference is, the lower the confidence level is. The confidence levels of a region in an estimated image may be determined based on a confidence distribution model. The confidence distribution model may be set by a user or according to a default setting of the MRI system 100. For example, the confidence distribution model may be obtained based on statistical analysis of multiple groups of testing data obtained by a target neural network model as described in FIG. 6. A group of historical test data may include a test image generated by the target neural network model and a reference test image corresponding to the test image. The reference test image may be reconstructed based on test k-space data with a higher sampling rate than a sampling rate according to the Nyquist sampling theorem.

In some embodiments, W may be in the frequency domain denoted by Equation (3) as follows:

$$W = MF \quad (3),$$

where F refers to Fourier transform, M refers to weight factors as described elsewhere in the disclosure.

In some embodiments, the sparse transformation model may be constructed based on a total variation (TV) operation function. The TV operation function may be configured to constrain noises in one of the one or more candidate images based on a noise level of one of the one or more estimated images. The total variation (TV) operation function may include a weight operator associated with noise levels or a noise distribution of the one or more estimated images. The weight operator may include a plurality of weight factors corresponding to various regions in an estimated image. The greater the noise level of a region is, the lower the weight factor corresponding to the region may be. As used herein, a region in an estimated image may include one or more pixels or voxels.

For example, the sparse transformation model may be denoted by Equation (4) as follows:

$$T(s_{pred}, s) = TV(Hs) \quad (4),$$

where TV refers to an isotropic or anisotropic operator, H refers to a weighting operator in the spatial domain. The weight operator H may be denoted by Equation (5) as follows:

$$H(r) = \begin{cases} \dfrac{F_{lp}(s_{pred}(r))}{s_{pred}(r)} & |s_{pred}(r)| > \varepsilon \\ 1.0 & |s_{pred}(r)| \leq \varepsilon \end{cases} \quad (5)$$

where $F_{lp}$ refers to a low-pass filter in the spatial domain, r refers to the location of a pixel of an image, $s_{pred}(r)$ refers to the one or more estimated images, and $\varepsilon$ refers to a noise level threshold. Exemplary low-pass filters may include a mean low-pass filter, a median low-pass filter, a k-space low-pass filter, or the like, or any combination thereof.

In some embodiments, the objective function may include one or more additional regularization terms associated with the one or more candidate images. The one or more candidate images may be constructed based on a sparse transform, a parallel imaging technique, a half-Fourier imaging technique, or the like, or any combination thereof. For example, the objective function may be denoted by Equation (6) as follows:

$$\min_s \{\|y - \Theta s\|_2^2 + \lambda_1 \|T(s_{pred}, s)\|_1 + \qquad (6)$$
$$\lambda_2 \|\psi s\|_1 + \lambda_3 TV(s) + \lambda_4 \|(G-1)(Fs)\|_2^2\},$$

where $\lambda_3$ refers to a third scalar factor, $\lambda_4$ refers to a fourth scalar factor, TV refers to a total variation function, G refers to a series of k-space synthesis convolution operations, I refers to a unit matrix, Fs refers to a phase encoding function associated with the one or more candidate images (e.g., target images). As shown in Equation (6), $\lambda_2 \|\psi s\|_1$ may be configured to constrain sparsity of one of the one or more candidate images. $\lambda_3 TV(s)$ may be configured to constrain noises of the one or more candidate images (e.g., target images). $\lambda_4 \|(G-1)(Fs)\|_2^2$ may be configured to determine the one or more candidate images using a parallel imaging technique based on a sensitivity function of RF coils of an MR scanner (e.g., the MR scanner 110). The phase encoding function may be determined based on the sensitivity function of RF coils in the MR scanner. The sensitivity function of RF coils in the MR scanner may be determined by the MRI system 100 according to one or more properties of the RF coils (e.g., a position of an RF coil). The third scalar factor $\lambda_3$ and the fourth scalar factor $\lambda_4$ may be set by a user according to a clinical demand or a default setting of the MRI system 100. For example, the third scalar factor $\lambda_3$ and/or the fourth scalar factor $\lambda_4$ may be a constant in a range from 0 to 2, or from 0 to 1, etc.

In 706, a reference value associated with the objective function may be determined. Operation 706 may be performed by the image reconstruction module 406. In some embodiments, the value of the objective function corresponding to the one or more initial candidate images as described in 702 may be designated as the reference value. In some embodiments, the reference value may be set as a value smaller than a threshold. The threshold may be set by a user or operator or set automatically by the MRI system 100 according to, e.g., a default setting of the MRI system 100. For example, the reference value may be any value within a range of 0 to 1.

In 708, the value of the objective function may be determined based on the one or more current candidate image. Operation 708 may be performed by the image reconstruction module 406. The value of the objective function may be determined according to Equation (1) or Equation (6) as described in 704. For example, the value of the objective function associated with the one or more current candidate images may be determined by substituting a magnitude of the one or more current candidate images into the objective function (e.g., the consistency term of the objective function). The magnitude of the one or more candidate images may be determined by the intensity (e.g., gray value) of a plurality of pixels inside the one or more current candidate images.

In 710, the current iteration count may be updated. Operation 710 may be performed by the image reconstruction module 406. In each iteration, the current iteration count may be added by 1. As used herein, the iteration count may also be referred to as the times of iterations.

In 712, whether the value of the objective function is smaller than the reference value may be determined. Operation 712 may be performed by the image reconstruction module 406. In response to a determination that the value of the objective function is equal to or greater than the reference value of the objective function, process 700 may proceed to operation 714. In response to a determination that the value of the objective function is smaller than the reference value, process 700 may proceed to operation 716.

In 714, the one or more current candidate images may be updated. Operation 714 may be performed by the image reconstruction module 406. In some embodiments, the one or more current candidate images may be updated based on prior candidate images generated in a previous iteration. In some embodiments, the one or more current candidate images may be updated based on the one or more estimated images as described elsewhere in the present disclosure (e.g., FIG. 6 and the descriptions thereof).

In 716, the value of the objective function associated with the one or more current candidate images may be designated as the reference value. Operation 716 may be performed by the image reconstruction module 406. The reference value determined in 706 may be updated based on the value of the objective function determined in 708.

In 718, whether a termination condition is satisfied may be determined. Operation 718 may be performed by the image reconstruction module 406. In response to a determination that the termination condition is not satisfied, process 700 may return to 714. In response to a determination that the preset condition is satisfied, process 700 may proceed to 720. In some embodiments, the termination condition may be a condition that the change in values of the objective function in the two or more consecutive iterations may be equal to or smaller than a threshold. The threshold may be part of default settings of the processing device 120 or may be set by a user (e.g., a doctor). In some embodiments, the termination condition may be a condition that the current iteration count may be equal to or larger than a count threshold. In some embodiments, if the current iteration times is equal to or larger than the count threshold, the iteration may be terminated, and the process 700 may proceed to 720. In some embodiments, if the current iteration times is less than the count threshold, process 700 may return to 714, and a next iteration may be started.

In 720, the one or more current candidate images may be designated as one or more target images. Operation 720 may be performed by the image reconstruction module 406.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, process 700 may further include one or more storing operations. For example, process 700 may include storing the value of the objective function generated in each iteration. As another example, process 700 may include storing current iteration times. In some embodiments, the one or more candidate images may be processed together as a candidate image sequence. The one or more target images may be determined as a target image sequence based on the candidate image sequence according to the iterative process 700. In some embodiments, each of the one or more candidate images may be processed individually according to the iterative process 700. One single target image may be determined based on one of the one or more candidate images corresponding to the one single target image when the iterative process 700 is performed once.

FIG. 8 is a flowchart illustrating an exemplary process 800 for training a neural network model according to some embodiments of the present disclosure. In some embodiments, one or more operations of process 800 illustrated in FIG. 8 may be implemented in the MRI system 100 illustrated in FIG. 1. For example, process 800 illustrated in FIG. 8 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3). In some embodiments, one portion of operation 604 illustrated in FIG. 6 may be performed according to the process 800. For example, the target neural network model as described in operation 604 may be determined according to process 800.

In 802, multiple groups of training data may be obtained. Each group of the multiple groups of training data may include image data (also referred to as second image data) and reference image data (also referred to as second reference image data) corresponding to the image data. Operation 802 may be performed by the model determination module 404. A sampling rate associated with the reference image data may exceed a sampling rate associated with the corresponding image data in the same group. As used herein, the image data may also be referred to as undersampling image data with a low sampling rate. The reference image data may be associated with a high sampling rate compared to the undersampling image data. In some embodiments, the undersampling image data in a specific group of the multiple groups of training data may include a plurality of undersampling images acquired by scanning a sample based on different first pulse sequences. The reference image data in the specific group may include one or more reference images acquired by scanning the sample based on one or more second pulse sequences. In some embodiments, the second pulse sequences may be a fully sampled pulse sequence or an undersampling pulse sequence with a shorter time. In some embodiments, the plurality of undersampling images may correspond to different reference images. A specific undersampling image with a lower sampling rate may correspond to a specific reference image with a higher sampling rate. The repetition time associated with a second pulse sequence corresponding to the specific reference image may be shorter than that of a first pulse sequence corresponding to the corresponding undersampling image. In some embodiments, the plurality of undersampling images may correspond to a same reference image. The second pulse sequence corresponding to the same reference image may be different from any one of the first pulse sequences. The repetition time associated with the second pulse sequence corresponding to the same reference image may be larger than that of each of the first pulse sequences corresponding to the plurality of undersampling images. For example, for a scan of the head of a patient, a first pulse sequence may include a T1 flair pulse sequence and/or a T2 flair pulse sequence with a longer repetition time. A second pulse sequence may include a T2 pulse sequence with a shorter repetition time with respect to the first pulse sequence.

In 804, a neural network model may be obtained. Operation 804 may be performed by the model determination module 404. In some embodiments, the neural network model may be stored in a storage device as an application or a part thereof. The neural network model may be constructed based on at least one of a convolutional neural network model (CNN), a fully convolutional neural network (FCN) model, a generative adversarial network (GAN), a back propagation (BP) neural network model, a radial basis function (RBF) neural network model, a deep belief nets (DBN) neural network model, an Elman neural network model, or the like, or a combination thereof. In some embodiments, the neural network model may include multiple layers, for example, an input layer, multiple hidden layers, and an output layer. The multiple hidden layers may include one or more convolutional layers, one or more batch normalization layers, one or more activation layers, a fully connected layer, a cost function layer, etc. Each of the multiple layers may include a plurality of nodes. In some embodiments, the neural network model may be defined by a plurality of parameters. Exemplary parameters of the neural network model may include the size of a convolutional kernel, the number of layers, the number of nodes in each layer, a connected weight between two connected nodes, a bias vector relating to a node, etc. The connected weight between two connected nodes may be configured to represent a proportion of an output value of a node to be as an input value of another connected node. The bias vector relating to a node may be configured to control an output value of the node deviating from an origin.

Different neural networks may have different structures. Taking a GAN model as an example, the GAN model may include a generative network configured to generate images and a discriminative network configured to evaluate the images generated by the generative network. For example, the generative network may transform an aliasing image with a lower sampling rate (e.g., the intermediate images generated based on the k-space data acquired based on an undersampling technique as described in FIG. 6) and the reference image with a higher sampling rate into a de-aliasing image. The discriminative network may determine a difference between the de-aliasing image generated by the generative network and the reference image generated based on, e.g., fully sampled k-space data. The training of the GAN model may be used to increase the error rate of the discriminative network so that the discriminative network cannot distinguish the reference image and the de-aliasing image. And the training of the GAN model may be used to decrease the error rate of the generative network so that the generated de-aliasing image approaches the reference image. More descriptions for a neural network model may be found elsewhere in the present disclosure (e.g., FIG. 10 and the descriptions thereof).

In 806, the neural network model may be trained using the multiple groups of training data to generate a target neural network model. Operation 806 may be performed by the model determination module 404. Exemplary neural network training algorithm may include a gradient descent algorithm, a Newton's algorithm, a Quasi-Newton algorithm, a Levenberg-Marquardt algorithm, a conjugate gradient algorithm, or the like, or a combination thereof, as exemplified in FIG. 9 and the description thereof. In some embodiments, the neural network model may be trained by performing a plurality of iterations based on a cost function. Before the plurality of iterations, the parameters of the neural network model may be initialized. For example, the connected weights and/or the bias vector of nodes of the neural network model may be initialized to be random values in a range, e.g., the range from −1 to 1. As another example, all the connected weights of the neural network model may have a same value in the range from −1 to 1, for example, 0. As still an example, the bias vector of nodes in the neural network model may be initialized to be random values in a range from 0 to 1. In some embodiments, the parameters of the neural network model may be initialized based on a Gaussian random algorithm, a Xavier algorithm, etc. Then the plurality of iterations may be performed to update the parameters of the neural network model until a condition is satisfied. The condition may provide an indication of whether the neural network model is sufficiently trained. For example, the condition may be satisfied if the value of the cost function associated with the neural network model is minimal or smaller than a threshold (e.g., a constant). As another example, the condition may be satisfied if the value of the cost function converges. The convergence may be deemed to have occurred if the variation of the values of the cost function in two or more consecutive iterations is smaller than a threshold (e.g., a constant). As still an example, the condition may be satisfied when a specified number of iterations are performed in the training process.

For each of the plurality of iterations, an undersampling image and a corresponding reference image in one group of the plurality of groups of training data may be inputted into the neural network model. The undersampling image and the corresponding reference image may be processed by one or more layers of the neural network model to generate an estimated image (e.g., a fully sampled image) corresponding to the undersampling image. The estimated image may be compared with the reference image associated with the undersampling image based on the cost function of the neural network model. The cost function of the neural network model may be configured to assess a difference between a testing value (e.g., the estimated image) of the neural network model and a desired value (e.g., the reference image associated with the image). If the value of the cost function exceeds a threshold in a current iteration, the parameters of the neural network model may be adjusted and updated to cause the value of the cost function (i.e., the difference between the estimated image and the reference image) smaller than the threshold. Accordingly, in a next iteration, another group of training data may be inputted into the neural network model to train the neural network model as described above until the condition is satisfied. The trained neural network model (i.e., the target neural network model) may be configured to output an estimated image associated with a specific undersampling image based on the mapping relationship when the specific undersampling image is inputted into the trained neural network model. In some embodiments, the trained neural network model may be determined based on the updated parameters. In some embodiments, the target neural network model may be transmitted to the storage device 130, the storage module 408, or any other storage device for storage.

In some embodiments, a training set of the target neural network model may be updated based on added data (e.g., the k-space data obtained in 602 and the estimated images generated in 604) over a period of time (e.g., every other month, every two months, etc.). In some embodiments, the target neural network model may be updated according to an instruction of a user, clinical demands, the updated training set, or a default setting of the MRI system 100. For example, the target neural network model may be updated at set intervals (e.g., every other month, every two months, etc.). As another example, the target neural network model may be updated based on added data in the training set of the target neural network model over a period of time (e.g., every other month, every two months, etc.). If the quantity of the added data in the training set over a period of time is greater than a threshold, the target neural network model may be updated based on the updated training set.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, before being input into the neural network model, one or more intermediate images may be reconstructed based on the k-space data. The one or more intermediate images may be inputted into the neural network model. The one or more estimated images may be generated by the neural network model based on the inputted intermediate images. In some embodiments, the k-space data may be inputted to the neural network model. Estimated k-space data may be generated by the neural network model based on the inputted k-space data. The estimated k-space data corresponding to the second sampling rate. The one or more estimated images may be reconstructed based on the estimated k-space data.

Figure 9:
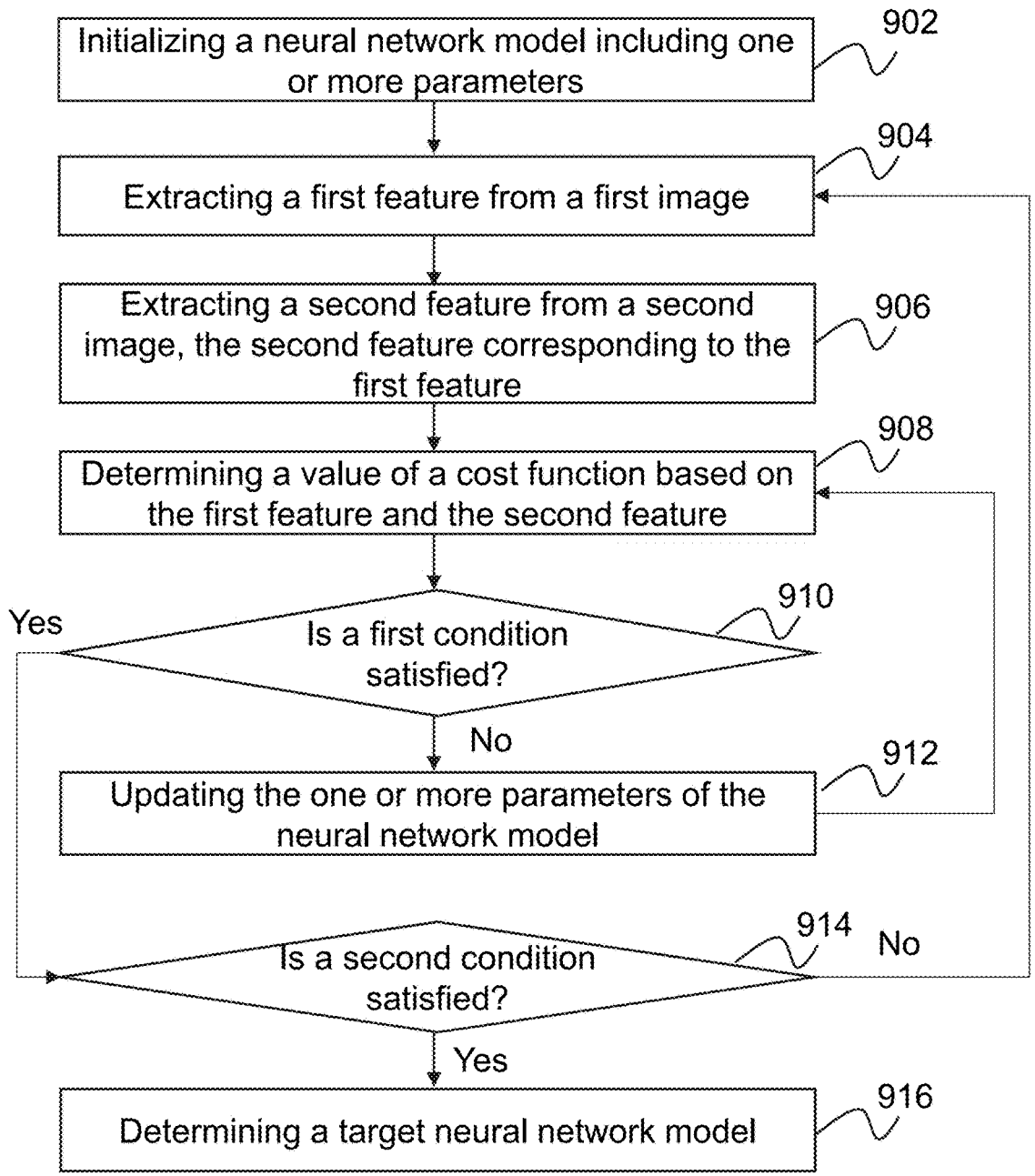
FIG. 9 is a flowchart illustrating an exemplary process for training a neural network model according to some embodiments of the present disclosure.

FIG. 9 is a flowchart illustrating an exemplary process 900 for training a neural network model according to some embodiments of the present disclosure. In some embodiments, one or more operations of process 900 illustrated in FIG. 9 may be implemented in the MRI system 100 illustrated in FIG. 1. For example, process 900 illustrated in FIG. 9 may be stored in the storage device 130 in the form of instructions, and invoked and/or executed by the processing device 120 (e.g., the processor 210 of the computing device 200 as illustrated in FIG. 2, the GPU 330 or CPU 340 of the mobile device 300 as illustrated in FIG. 3). Operation 604 as illustrated in FIG. 6 and/or operation 806 as illustrated in FIG. 8 may be performed according to process 900.

In 902, a neural network model including one or more parameters may be initialized. Operation 902 may be performed by the initialization unit 502. The neural network model may be obtained as described in connection with operation 804.

In some embodiments, the parameters of the neural network model may include the size of a convolutional kernel, the number of layers, the number of nodes in each layer, a connected weight between two connected nodes, a bias vector relating to a node, etc. The connected weight between two connected nodes may be configured to represent a proportion of an output value of a node to be as an input value of another connected node. In some embodiments, the connected weights of the neural network model may be initialized to be random values in a range, e.g., the range from −1 to 1. In some embodiments, all the connected weights of the neural network model may have a same value in the range from −1 to 1, for example, 0. The bias vector relating to a node may be configured to control an output value of the node deviating from an origin. In some embodiments, the bias vector of nodes in the neural network model may be initialized to be random values in a range from 0 to 1. In some embodiments, the parameters of the neural network model may be initialized based on a Gaussian random algorithm, a Xavier algorithm, etc.

In 904, a first feature may be extracted from a first image. Operation 904 may be performed by the extraction unit 504. The first image may be obtained as described in connection with operation 802. For example, the first image may be an undersampling image associated with a lower sampling rate as described elsewhere in the present disclosure (e.g., FIG. 8 and the descriptions thereof).

The first feature may relate to a first region in the first image. The first region may include one or more pixels or voxels. In some embodiments, the first region may be extracted based on a random sampling algorithm. Exemplary random sampling algorithms may include an acceptance-rejection sampling algorithm, an importance sampling algorithm, a Metropolis-Hasting algorithm, a Gibbs sampling algorithm, etc. In some embodiments, the first feature relating to the first region may be extracted from the first image by the neural network model (e.g., a convolution layer of the neural network model). The first feature may include a low-level feature (e.g., an edge feature, a texture feature, etc.), a high-level feature (e.g., a semantic feature), or a complicated feature (e.g., a deep hierarchical feature) that is determined by the neural network model.

In 906, a second feature corresponding to the first feature may be extracted from a second image. Operation 906 may be performed by the extraction unit 504. The second image may be obtained as described in connection with operation 806. For example, the second image may also be referred to as a reference image associated with a higher sampling rate compared to the sampling rate at which the k-space date corresponding to the first image is sampled. As a further example, the second image may be reconstructed based on fully sampled k-space data.

The second feature may relate to a second region in the second image. The second region may correspond to the first region. As used herein, the second region of a second image corresponding to the first region of a first image may refer to that the first region and the second region may be of the same size and at the same position in the first image and the second image, respectively. The second feature may include a low-level feature (e.g., an edge feature, a texture feature, etc.), a high-level feature (e.g., a semantic feature), a complicated feature (e.g., a deep hierarchical feature), etc., as described above.

Figure 10:
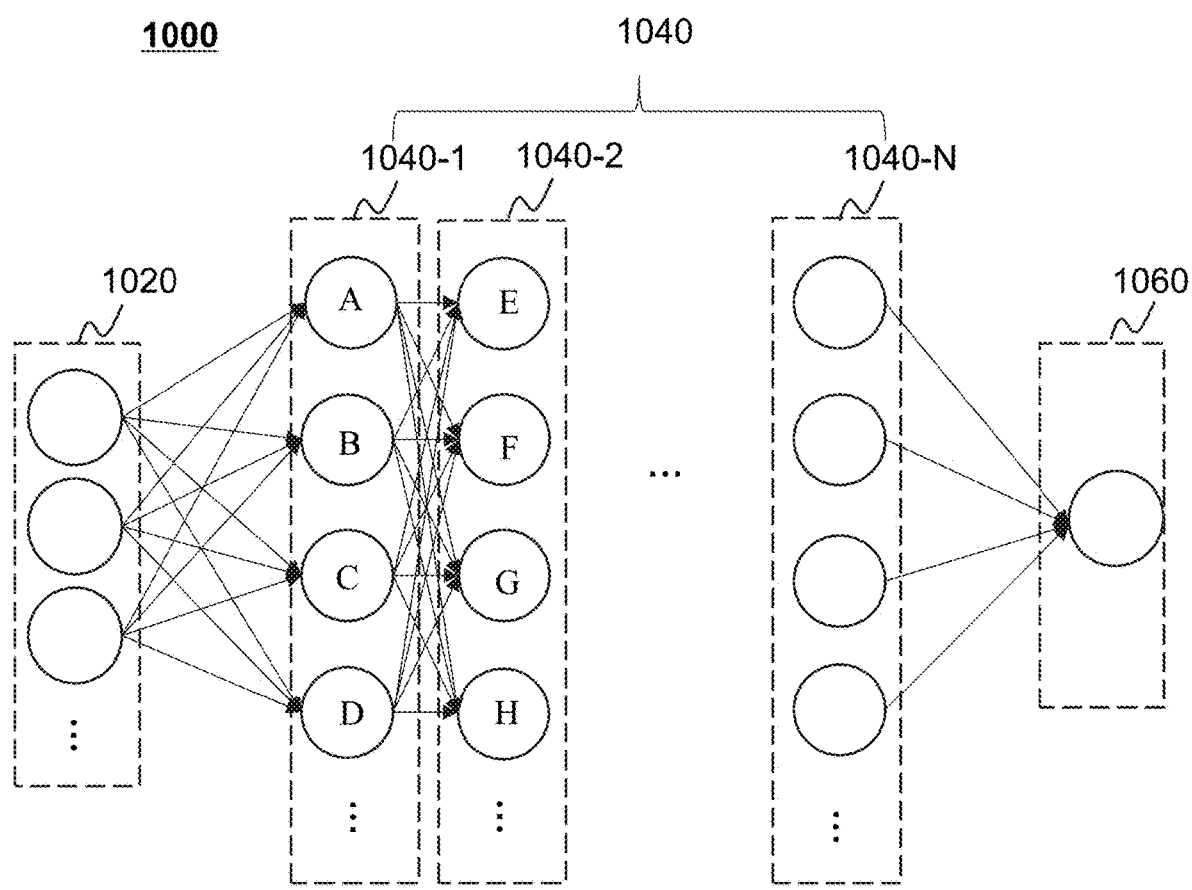
FIG. 10 is a schematic diagram illustrating an exemplary convolutional neural network (CNN) model according to some embodiments of the present disclosure.

In 908, a value of a cost function (also referred to as a loss function) may be determined based on the first feature and the second feature. Operation 908 may be performed by the calculation unit 506. The cost function may be configured to assess a difference between a testing value (e.g., the first feature) of the neural network and a desired value (e.g., the second feature). In some embodiments, the first feature may be inputted to the neural network model via an input layer (e.g., the input layer 1020 as illustrated in FIG. 10). The first feature may be transferred from a first hidden layer of the neural network model (e.g., the conventional layers 1040-1 as illustrated in FIG. 10) to the last hidden layer of the neural network model. The first feature may be processed in each of the multiple hidden layers. For example, the inputted first feature may be processed by one or more conventional layer (e.g., the conventional layers 1040-1 as illustrated in FIG. 10). The one or more conventional layers may be configured to perform an image transformation operation, an image enhancement operation, an image denoising operation, or any other operations on the first feature based on the parameters relating to nodes in the one or more conventional layers. The processed first feature processed by the hidden layers before the cost function layer may be inputted to the cost function layer. The value of the cost function layer may be determined based on the processed first feature processed by the layers before the cost function layers and the second feature.

In 910, a determination may be made as to whether a first condition is satisfied. Operation 910 may be performed by the judgment unit 508. If the first condition is satisfied, process 900 may proceed to operation 914. If the first condition is not satisfied, process 900 may proceed to 912. The first condition may provide an indication whether the neural network model is sufficiently trained. In some embodiments, the first condition may relate to a value of the cost function. For example, the first condition may be satisfied if the value of the cost function is minimal or smaller than a threshold (e.g., a constant). As another example, the first condition may be satisfied if the value of the cost function converges. In some embodiments, convergence may be deemed to have occurred if the variation of the values of the cost function in two or more consecutive iterations is equal to or smaller than a threshold (e.g., a constant). In some embodiments, convergence may be deemed to have occurred if a difference between the value of the cost function and a target value is equal to or smaller than a threshold (e.g., a constant). In some embodiments, the first condition may be satisfied when a specified number of iterations relating to the first feature and the second feature are performed in the training process.

In 912, the one or more parameters of the neural network model may be updated. Operation 912 may be performed by the initialization unit 502. In some embodiments, the parameter value of at least some nodes may be adjusted until the value of the cost function relating to the first feature satisfy the first condition. In some embodiments, the parameters of the neural network model may be adjusted based on a back-propagation (BP) algorithm. Exemplary BP algorithms may include a stochastic gradient descent algorithm, an Adam algorithm, an Adagrad algorithm, an Adadelta algorithm, an RMSprop algorithm, or the like, or a combination thereof.

In 914, a determination may be made as to whether the second condition is satisfied. Operation 914 may be performed by the judgment unit 508. If the second condition is satisfied, process 900 may proceed to 916. If the second condition is not satisfied, process 900 may return to 908 in which another first feature may be extracted from another region of the first image. In some embodiments, the second condition may be satisfied if a specified number of the first features and the second features are processed associated with the neural network model.

In 916, a target neural network model may be determined. Operation 916 may be performed by the initialization unit 502. In some embodiments, the target neural network model may be determined based on the updated parameters.

In some embodiments, process 900 may be repeated with respect to multiple training data including different pairs of first and second images to improve or optimize the neural network model until a termination condition is satisfied. In different rounds of process 900, different pairs of first and second images may be inputted into the neural network model. In some embodiments, the termination condition may be that a specific number of pairs of first images and second images have been analyzed. In some embodiments, the termination condition may be that a specific number of iterations have been performed.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. In some embodiments, operations 904 and 906 may be omitted.

FIG. 10 is a schematic diagram illustrating an exemplary convolutional neural network (CNN) model 1000 according to some embodiments of the present disclosure.

The CNN model may include an input layer 1020, hidden layers 1040, and an output layer 1060. The multiple hidden layers 1040 may include one or more convolutional layers, one or more Rectified Linear Units layers (ReLU layers), one or more pooling layers, one or more fully connected layers, or the like, or a combination thereof.

For illustration purposes, exemplary hidden layers 1040 of the CNN model, including a convolutional layer 1040-1, a pooling layer 1040-2, and a fully connected layer 1040-N, are illustrated. As described in connection with process 900, the model determination module 404 may acquire a first image as an input of the CNN model. The first image may be expressed as a two-dimensional (2D) or three-dimensional (3D) matrix including a plurality of elements (e.g., pixels or voxels). Each of the plurality of elements in the matrix may have a value (also referred to as pixel/voxel value) representing a characteristic of the element.

The convolutional layer 1040-1 may include a plurality of kernels (e.g., A, B, C, and D). The plurality of kernels may be used to extract features of a training image (e.g., the first image and the second image as described in FIG. 9). In some embodiments, each of the plurality of kernels may filter a portion (e.g., a region) of the first image to produce a specific feature corresponding to the portion of the first image. The feature may include a low-level feature (e.g., an edge feature, a texture feature, etc.), a high-level feature (e.g., a semantic feature), or a complicated feature (e.g., a deep hierarchical feature) that is calculated based on the kernel(s).

The pooling layer 1040-2 may take the output of the convolutional layer 1040-1 as an input. The pooling layer 1040-2 may include a plurality of pooling nodes (e.g., E, F, G, and H). The plurality of pooling nodes may be used to sample the output of the convolutional layer 1040-1, and thus may reduce the computational load of data processing and increase the speed of data processing of the imaging system 100. In some embodiments, the model determination module 404 may reduce the volume of the matrix corresponding to the first image in the pooling layer 1040-2.

The fully connected layer 1040-N may include a plurality of neurons (e.g., O, P, M, and N). The plurality of neurons may be connected to a plurality of nodes from the previous layer, such as a pooling layer. In the fully connected layer 1040-N, the model determination module 404 may determine a plurality of vectors corresponding to the plurality of neurons based on the features of the training image (e.g., the first image and the second image as described in FIG. 9) and further weigh the plurality of vectors with a plurality of weighting coefficients.

In the output layer 1060, the model determination module 404 may determine an output, such as a target image, based on the plurality of vectors and weighting coefficients obtained in the fully connected layer 1040-N.

It shall be noted that the CNN model may be modified when applied in different conditions. For example, in a training process, a loss function (also referred to as cost function in the disclosure) layer may be added to specify the deviation between a predicted output (e.g., a predicted high-dose image) and a true label (e.g., a reference high-dose image corresponding to the first image).

In some embodiments, the model determination module 404 may get access to multiple processing units, such as GPUs, in the MRI system 100. The multiple processing units may perform parallel processing in some layers of the CNN model. The parallel processing may be performed in such a manner that the calculations of different nodes in a layer of the CNN model may be assigned to two or more processing units. For example, one GPU may run the calculations corresponding to kernels A and B, and the other GPU(s) may run the calculations corresponding to kernels C and D in the convolutional layer 1040-1. Similarly, the calculations corresponding to different nodes in other type of layers in the CNN model may be performed in parallel by the multiple GPUs.

EXAMPLE

The examples are provided for illustration purposes, and not intended to limit the scope of the present disclosure.

Figure 11A:
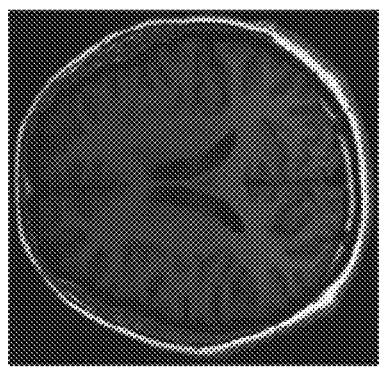
FIGS. 11A-11E are exemplary images of the head of a patient determined according to some embodiments of the present disclosure.
Figure 11B:
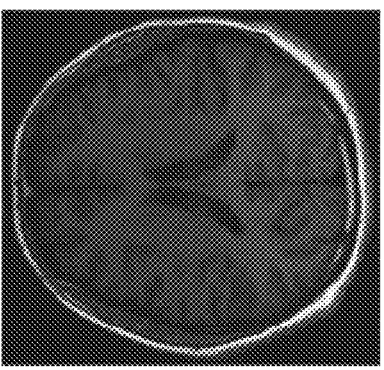
Figure 11C:
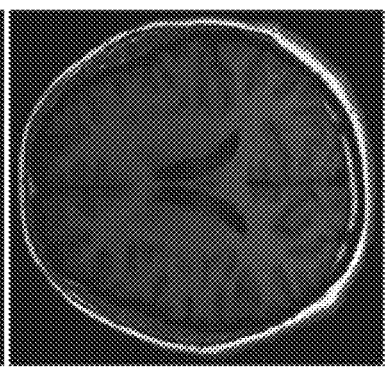
Figure 11D:
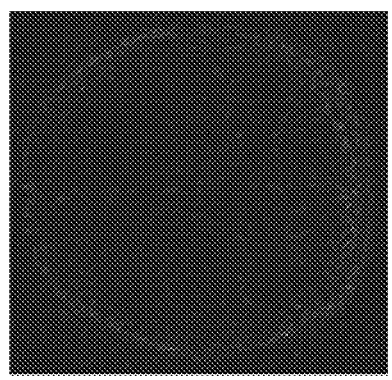
Figure 11E:
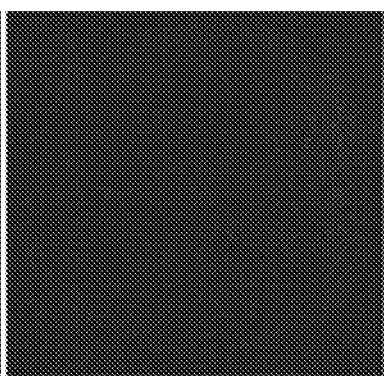

Example 1 Exemplary MR Images of the Head of a Patient Reconstructed Based on T1 Flair Pulse Sequence FIGS. 11A-11E are exemplary images of the head of a patient determined according to some embodiments of the present disclosure. The image shown in FIG. 11A was reconstructed based on fully sampled k-space data, also referred to as a fully sampled image. The image shown in FIG. 11B was an estimated image generated by the target neural network model as described in operation 604. The image shown in FIG. 11C was a reconstructed image based on the estimated image in FIG. 11B using the compressed sensing model as described in operation 606. The image shown in FIG. 11D illustrates an estimation error of the target neural network model determined by comparing the images shown in FIGS. 11A and 11B. The estimated error may represent a difference between the estimated image and the fully sampled image. The image shown in FIG. 11E illustrates a reconstruction error of the compressed sensing model determined by comparing the images shown in FIGS. 11A and 11C. The reconstruction error may represent a difference between the reconstructed image and the fully sampled image. Comparing images shown in FIG. 11D and FIG. 11E the reconstruction error is smaller than the estimation error, which means that the reconstructed image using the compressed sensing model shown in FIG. 11C is closer to the fully sampled image shown in FIG. 11A than the estimated image.

Example 2 Exemplary MR Images of the Head of a Patient Reconstructed Based on T2 Flair Pulse Sequence FIGS. 12A-12E are exemplary images of the head of a patient determined according to some embodiments of the present disclosure. Images shown in FIGS. 12A-12E were obtained as described in connection with images shown in FIGS. 11A-11E.

Figure 12A:
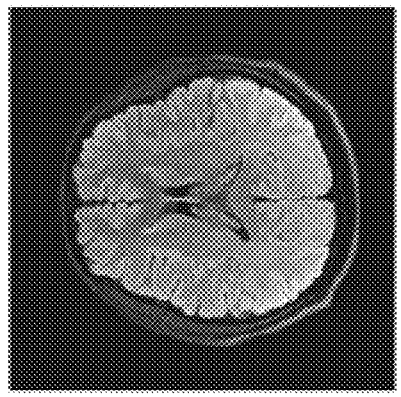
FIGS. 12A-12E are exemplary images of the head of a patient determined according to some embodiments of the present disclosure.
Figure 12B:
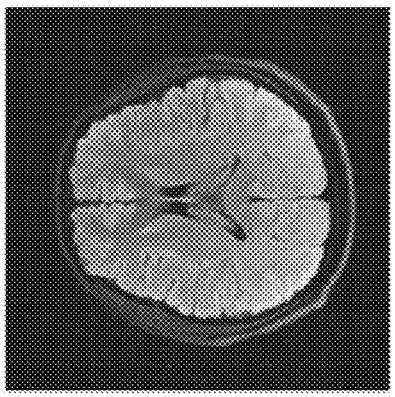
Figure 12C:
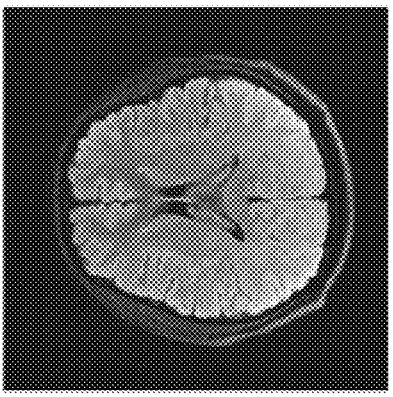
Figure 12D:
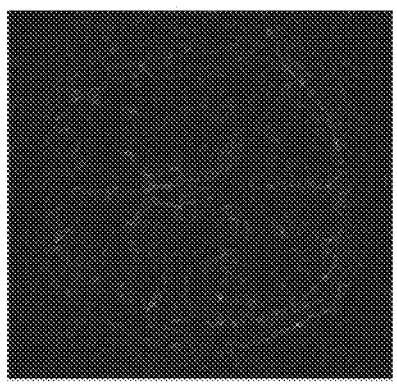
Figure 12E:
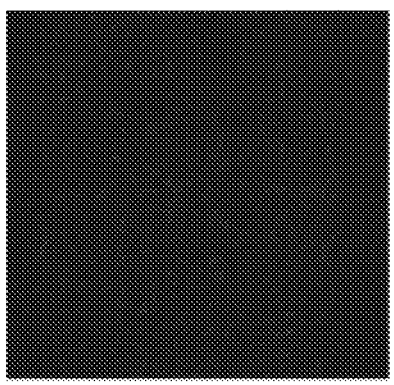

As shown in FIGS. 11D-11E and/or FIGS. 12D-12E, the reconstruction error is far less than the estimation error, indicating that a combination of the neural network model and the compressed sensing model may mitigate a loss of details in a reconstructed image and improve quality and accuracy of the reconstructed image.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electromagnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for magnetic resonance imaging (MRI), comprising:
   at least one storage device storing executable instructions, and at least one processor in communication with the at least one storage device, when executing the executable instructions, causing the system to:
  obtain k-space data associated with MR signals acquired by an MR scanner, the k-space data corresponding to a first sampling rate;
  generate one or more estimated images based on the k-space data and a target neural network model, the one or more estimated images corresponding to a second sampling rate that exceeds the first sampling rate; and
  determine one or more target images based on the one or more estimated images and the k-space data using a compressed sensing model, wherein the compressed sensing model is constructed based on the one or more estimated images.

2. The system of claim 1, wherein the target neural network model is trained to map first image data to one or more corresponding estimated first image data, a sampling rate associated with the corresponding estimated first image data exceeding a sampling rate associated with the first image data.

3. The system of claim 1, wherein the at least one processor is further configured to cause the system to:
  obtain multiple groups of training data, each group of the multiple groups of training data including second image data and reference second image data corresponding to the second image data, a sampling rate associated with the reference second image data exceeding a sampling rate associated with the second image data; and
  generate the target neural network model by training a neural network model using the multiple groups of training data.

4. The system of claim 3, wherein the second image data in each group of the multiple groups of training data includes a plurality of second images acquired based on different first pulse sequences, and the reference second image data in each group of the multiple groups of training data is acquired based on a second pulse sequence different from each of the first pulse sequences.

5. The system of claim 1, wherein to generate one or more estimated images based on the k-space data and a target neural network model, the at least one processor is further configured to cause the system to:
  reconstruct one or more intermediate images based on the k-space data; and
  generating the one or more estimated images by inputting the one or more intermediate images to the target neural network model.

6. The system of claim 1, wherein to generate one or more estimated images based on the k-space data and a target neural network model, the at least one processor is further configured to cause the system to:
  generate estimated k-space data by inputting the k-space data to the target neural network model, the estimated k-space data corresponding to the second sampling rate; and
  reconstruct the one or more estimated images based on the estimated k-space data.

7. The system of claim 1, wherein to reconstruct the one or more target images based on the one or more estimated images and the k-space data, the at least one processor is further configured to cause the system to:
  determine, based on the one or more estimated images and the k-space data, an objective function, the objective function including a consistency term and a regularization term, wherein
    the consistency term represents a difference between candidate k-space data associated with one or more candidate images and the k-space data; and
    the regularization term is constructed based on a sparse transformation model associated with the one or more estimated images; and
  determine the one or more target images by performing a plurality of iterations based on the objective function until a condition is satisfied, wherein each iteration includes updating the one or more candidate images.

8. The system of claim 7, wherein each iteration of the plurality of iterations includes:
  updating the one or more candidate images based on the one or more estimated images;
  updating the value of the objective function after each iteration based on the updated one or more candidate images obtained in a most recent iteration; and
  determining whether the value of the objective function satisfies the condition.

9. The system of claim 7, wherein the sparse transformation model is constructed based on a differential operation function, the differential operation function being configured to constrain a difference between the one or more estimated images and one of the one or more candidate images.

10. The system of claim 9, wherein the differential operation function includes a weight operator in a spatial domain associated with a confidence level of the one or more estimated images or a weight operator in a frequency domain associated with a confidence level of at least one portion of space data of the one or more estimated images, the space data of the one or more estimated images being acquired by performing Fourier Transform on the one or more estimated images.

11. The system of claim 7, wherein the sparse transformation model is constructed based on a total variation (TV) operation function, the TV operation function being configured to constrain noises in one of the one or more candidate images based on a noise level of the one or more estimated images.

12. The system of claim 11, wherein the total variation (TV) operation function includes a weight operator associated with the noise level of the one or more estimated images.

13. The system of claim 7, wherein the objective function further comprises a second regularization term, the second regularization term being configured to constrain sparsity of one of the one or more candidate images.

14. The system of claim 1, wherein to reconstruct the one or more target images based on the one or more estimated images and the k-space data using a compressed sensing model, the at least one processor is further configured to cause the system to:
  determine, based on the one or more estimated images and the k-space data, an objective function, the objective function including a consistency term and a third regularization term, wherein
    the consistency term represents a difference between candidate k-space data associated with one or more candidate images and the k-space data; and
    the third regularization term represents a difference between the one or more candidate images and the one or more estimated images; and determine the one or more target images by performing a plurality of iterations based on the objective function until a condition is satisfied, wherein each iteration includes updating the one or more candidate images.

15. The system of claim 14, wherein each iteration of the plurality of iterations includes:
updating the one or more candidate images based on the one or more estimated images;
updating the value of the objective function after each iteration based on the updated candidate images obtained in a most recent iteration; and
determining whether the value of the objective function satisfies the condition.

16. The system of claim 1, wherein the target neural network model is constructed based on at least one of a convolutional neural network model (CNN), a fully convolutional neural network (FCN) model, or a generative adversarial network (GAN).

17. The system of claim 1, wherein the k-space data is acquired by the MR scanner according to a pulse sequence designed based on an undersampling pattern.

18. A method for magnetic resonance imaging (MRI) implemented on a computing apparatus, the computing apparatus including at least one processor and at least one storage device, the method comprising:
obtaining, by the at least one processor, k-space data associated with MR signals acquired by an MR scanner, the k-space data corresponding to a first sampling rate;
generating, by the at least one processor, one or more estimated images based on the k-space data and a target machine learning model, the one or more estimated images corresponding to a second sampling rate that exceeds the first sampling rate; and
determining, by the at least one processor, one or more target images based on the one or more estimated images and the k-space data using a compressed sensing model, wherein the compressed sensing model is constructed based on the one or more estimated images.

19. The method of claim 18, wherein determining, by the at least one processor, one or more target images based on the one or more estimated images and the k-space data using a compressed sensing model further includes:
determining, based on the one or more estimated images and the k-space data, an objective function, the objective function including a consistency term and a regularization term, wherein
the consistency term represents a difference between candidate k-space data associated with one or more candidate images and the k-space data; and
the regularization term is constructed based on a sparse transformation model associated with the one or more estimated images; and
determining the one or more target images by performing a plurality of iterations based on the objective function until a condition is satisfied, wherein each iteration includes updating the one or more candidate images.

20. A non-transitory computer-readable medium storing at least one set of instructions, wherein when executed by at least one processor, the at least one set of instructions directs the at least one processor to perform acts of:
obtaining, by the at least one processor, k-space data associated with MR signals acquired by an MR scanner, the k-space data corresponding to a first sampling rate;
generating, by the at least one processor, one or more estimated images based on the k-space data and a target neural network model, the one or more estimated images corresponding to a second sampling rate that exceeds the first sampling rate; and
determining, by the at least one processor, one or more target images based on the one or more estimated images and the k-space data using a compressed sensing model, wherein the compressed sensing model is constructed based on the one or more estimated images.

* * * * *